(12) United States Patent  
Clark et al.

(10) Patent No.: US 8,966,329 B2  
(45) Date of Patent: Feb. 24, 2015

(54) FAST PARALLEL TEST OF SRAM ARRAYS

(75) Inventors: Lawrence T. Clark, Phoenix, AZ (US); Yu Cao, Gilbert, AZ (US)

(73) Assignee: Arizona Board of Regents for and on behalf of Arizona State University, Scottsdale, AZ (US)

( * ) Notice: Subject to any disclaimer, the term of this patent is extended or adjusted under 35 U.S.C. 154(b) by 178 days.

(21) Appl. No.: 13/808,438

(22) PCT Filed: Jul. 19, 2011

(86) PCT No.: PCT/US2011/044440  
§ 371 (c)(1),  
(2), (4) Date: Jan. 4, 2013

(87) PCT Pub. No.: WO2012/012369  
PCT Pub. Date: Jan. 26, 2012

(65) Prior Publication Data  
US 2013/0111282 A1    May 2, 2013

Related U.S. Application Data

(60) Provisional application No. 61/365,396, filed on Jul. 19, 2010.

(51) Int. Cl.  
*G11C 29/00* (2006.01)  
*G11C 29/08* (2006.01)  
*G11C 29/28* (2006.01)  
*G11C 29/40* (2006.01)  
*G11C 11/41* (2006.01)  
*G11C 29/12* (2006.01)  
*G11C 29/26* (2006.01)

(52) U.S. Cl.  
CPC .............. *G11C 29/08* (2013.01); *G11C 11/41* (2013.01); *G11C 29/28* (2013.01); *G11C 29/40* (2013.01); *G11C 2029/1202* (2013.01); *G11C 2029/1204* (2013.01); *G11C 2029/2602* (2013.01)  
USPC ........................................................ 714/721

(58) Field of Classification Search  
None  
See application file for complete search history.

(56) References Cited

U.S. PATENT DOCUMENTS

| 5,301,155 A | 4/1994 | Wada et al. |
| 6,044,481 A * | 3/2000 | Kornachuk et al. ........... 714/724 |
| 6,119,249 A | 9/2000 | Landry |

(Continued)

FOREIGN PATENT DOCUMENTS

KR    10-2001-0027544 A    4/2001

OTHER PUBLICATIONS

International Search Report and Written Opinion for PCT/US2011/04440, mailed Feb. 17, 2012.

(Continued)

*Primary Examiner* — Daniel McMahon  
(74) *Attorney, Agent, or Firm* — Withrow & Terranova, P.L.L.C.

(57) ABSTRACT

In general, each parallel test operation on Static Random Access Memory (SRAM) cells is a test operation performed on a block of the SRAM cells in parallel, or simultaneously. In one embodiment, the SRAM cells are arranged into multiple rows and multiple columns where the columns are further arranged into one or more column groups. The block of the SRAM cells for each parallel test operation includes SRAM cells in two or more of the rows, SRAM cells in two or more columns in the same column group, or both SRAM cells in two or more rows and SRAM cells in two or more columns in the same column group.

35 Claims, 22 Drawing Sheets

(56) References Cited

U.S. PATENT DOCUMENTS 6,301,165 B1 * 10/2001 Kim .................. 365/189.07
6,333,872 B1 * 12/2001 Ouellette et al. ......... 365/189.06
6,990,038 B1 * 1/2006 Chan et al. .............. 365/230.05

OTHER PUBLICATIONS

International Preliminary Report on Patentability for International Patent Application PCT/US2011/044440 mailed Jan. 31, 2013, 5 pages.
Seevinck, E. et al., "Static-Noise Margin Analysis of MOS SRAM Cells", IEEE Journal of Solid-State Circuits, Oct. 1987, pp. 748-754, vol. SC-22, Issue 5.
Bhavnagarwala, A. et al., "The Impact of Intrinsic Device Fluctuations on CMOS SRAM Cell Stability", IEEE Journal of Solid-State Circuits, Apr. 2001, pp. 658-665, vol. 36, Issue 4.
Burnett, D. et al., "Implications of Fundamental Threshold Voltage Variations for High-Density SRAM and Logic Circuits", Symposium on VLSI Technology Digest of Technical Papers, 1994, pp. 15-16.
Sengupta, S. et al., "Defect-Based Test: A Key Enabler for Successful Migration to Structural Test", Intel Technology Journal Q1, 1999, pp. 1-14.
Van De Goor, A., "Chapter 4: Functional RAM Chip Testing", Testing Semiconductor Memories: Theory and Practice, 1991, pp. 93-123, John Wiley & Sons, Ltd. West Sussex England.
Van De Goor, A., "Chapter 12: Built-in Self Test", Testing Semiconductor Memories: Theory and Practice, 1991, pp. 344-350, John Wiley & Sons, Ltd. West Sussex England.

* cited by examiner

FAST PARALLEL TEST OF SRAM ARRAYS

RELATED APPLICATIONS

This application is a 35 USC 371 national phase filing of International Application No. PCT/US 11/44440, filed Jul. 19, 2011, which claims the benefit of U.S. provisional patent application Ser. No. 61/365,396, filed Jul. 19, 2010, the disclosures of which are hereby incorporated herein by reference in their entireties.

FIELD OF THE DISCLOSURE

The present disclosure relates to Static Random Access Memory (SRAM), and more particularly relates to testing SRAM cells.

BACKGROUND

Static Random Access Memory (SRAM) cells comprise an increasing portion of modern very large scale integrated (VLSI) circuits. A conventional SRAM cell 10 is illustrated in FIG. 1. As illustrated, the SRAM cell 10 includes pull-down transistors M1 and M3, pull-up transistors M2 and M4, and access transistors M5 and M6 connected as shown. The SRAM cell 10 is written differentially, with one bit line (e.g., BL) at a high potential and the other bit line (e.g., BLN) at a low potential. A write operation is performed by driving a voltage level corresponding to a desired logic value onto the bit line (BL) and/or its converse onto the bit line not (BLN) while asserting a word line (WL) to turn-on the access transistors M5 and M6. As a result, the desired logic value is stored at output node C, and a complementary logic value is stored at output node CN. During a write operation, the access transistor M5 must overpower the pull-up transistor M2 (i.e., the SRAM cell 10 is a ratioed circuit during writes). Adequate write margin is ensured by sizing the access transistor M5 to be stronger than the pull-up transistor M2. The write margin is typically defined in one of two ways. The direct current (DC) approach is to measure the bit line (BL) voltage required to flip the state of the SRAM cell 10 (i.e., flip the output node C from storing a logic "1" to a logic "0" or vice versa) by keeping one of the bit lines (e.g., BL) high and lowering the other bit line (e.g., BLN) from $V_{DD}$ towards $V_{SS}$ until the state of the SRAM cell 10 is flipped. Alternatively, a delay to write the SRAM cell 10 when the bit line (BL) is driven to $V_{SS}$ may be measured.

A read operation is performed by pre-charging the bit line (BL) and the bit line not (BLN) to a high voltage level and asserting the word line (WL) to a high voltage level in order to turn on the access transistors M5 and M6. If a logic "0" is stored at the output node C, the pull-up transistor M2 is off and the pull-down transistor M1 is on. Due to the voltage division across the transistors M1 and M5, the voltage at the output node C rises above $V_{SS}$. This rise in voltage at the output node C decreases a Static Noise Margin (SNM) of the SRAM cell 10 during the read operation. The rise in voltage at the output node C when reading a logic "0" is determined by the cell ratio of the gate size of the pull-down transistor M1 to that of the access transistor M5. The higher the cell ratio, the smaller the voltage drop across the pull-down transistor M1 and the greater the SNM of the SRAM cell 10. Thus, the pull-down transistor M1 must be stronger than the access transistor M5 so that a logic "0" stored at the output node C is not pulled high enough to flip the cell during a read operation. Similarly, the pull-down transistor M3 must be stronger than the access transistor M6 so that a logic "0" stored at the output node CN is not pulled high during a read operation. However, there is a conflicting restraint that the pull-up transistors M2 and M4 be weaker than the access transistors M5 and M6 in order to ensure write-ability, thereby constraining the design space for the conventional (six transistor) SRAM cell 10.

One issue with the SRAM cell 10 is that the SRAM cell 10 must typically be tested to determine whether the SRAM cell 10 meets desired read and/or write margins. For a single SRAM cell 10, such testing is fairly simple. However, an issue arises in conventional SRAM circuits, which include thousands to millions of SRAM cells 10. A conventional SRAM circuit includes multiple banks of SRAM cells 10. Each bank of SRAM cells 10 includes numerous columns of SRAM cells 10 that are typically arranged into column groups. The number of SRAM cells 10 in each bank may be on the order of hundreds, thousands, or more. In each bank, only one SRAM cell 10 per column group can be accessed (read or written) at a time. Thus, testing of the write margin and/or read SNM of the SRAM cells 10 in each of the banks requires a significant amount of time.

Therefore, there is a need for systems and methods that enable fast testing of SRAM circuitry.

SUMMARY

Systems and methods for performing parallel test operations on Static Random Access Memory (SRAM) cells are disclosed. In general, each parallel test operation is a test operation performed on a block of the SRAM cells in parallel, or simultaneously. In one embodiment, the SRAM cells are arranged into multiple rows and multiple columns where the columns are further arranged into one or more column groups. The block of the SRAM cells for each parallel test operation includes SRAM cells in two or more of the rows, SRAM cells in two or more columns in the same column group, or both SRAM cells in two or more rows and SRAM cells in two or more columns in the same column group.

In one embodiment, the SRAM cells include multiple rows and columns of SRAM cells. In order to test the SRAM cells, a desired precondition logic value is first written to the SRAM cells via one or more parallel write operations, where each parallel write operation writes the desired precondition logic value to a different block of SRAM cells. Optionally, in some embodiments, a stress is simultaneously applied to the SRAM cells via one or more parallel stress operations, where each parallel stress operation stresses a different block of the SRAM cells. The parallel stress operation may be, for example, a parallel stress operation that tests a write margin or read static noise margin (SNM) of the SRAM cells in the block. The columns of the SRAM cells are read via one or more parallel read operations, where each parallel read operation reads the columns in a different block of the SRAM cells. Based on results of the one or more parallel read operations, any column groups and/or columns that contain one or more SRAM cells that failed the test are identified.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to parallel test operations for Static Random Access Memory (SRAM) cells that are preferably used to test the SRAM cells in parallel. Systems and methods are disclosed for performing parallel test operations on SRAM cells in a bank of SRAM cells (referred to herein as an SRAM bank). Notably, conventional SRAM banks do not enable parallel operations. In particular, conventional SRAM banks do not allow multiple simultaneous word line (WL) assertions since multiple simultaneous WL assertions would cause contention between SRAM cells being read and erroneous writes to multiple SRAM cells.

Figure 2:
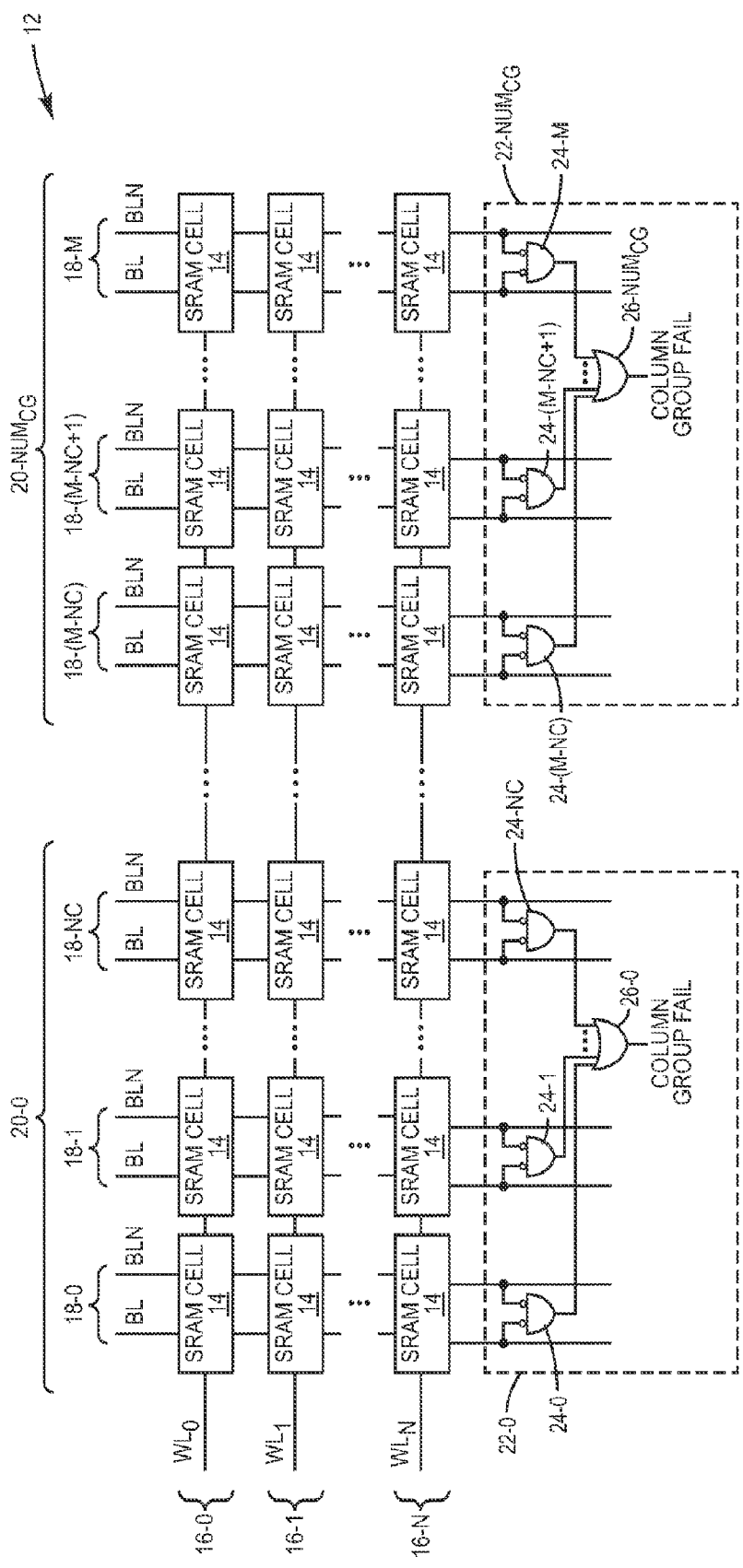
FIG. 2 illustrates an SRAM bank configured for parallel test operations according to one embodiment of the present disclosure.

FIG. 2 illustrates an SRAM bank 12 enabling parallel operations according to one embodiment of the present disclosure. As illustrated, the SRAM bank 12 includes a number of SRAM cells 14 arranged in multiple rows 16-0 through 16-N and multiple columns 18-0 through 18-M (generally referred to herein collectively as columns 18 and individually as column 18), where the number of rows is N+1 and the number of columns is M+1. Notably, the number of rows is greater than 1, and the number of columns is greater than 1. Access to the rows 16-0 through 16-N for read or write operations is controlled by corresponding WLs $WL_0$ through $WL_N$. The columns 18-0 through 18-M of the SRAM cells 14 are connected to separate bit lines (BLs) and bit line nots (BLNs). Further, the columns 18-0 through 18-M are arranged into column groups 20-0 through 20-$NUM_{CG}$ (generally referred to herein collectively as column groups 20 and individually as column group 20), where the number of column groups is $NUM_{CG}+1$, where the number of column groups is equal to the number of columns (M+1) divided by the number of columns per column group (NC+1). Thus, for example, if there are 512 columns and 8 columns per column group, then the number of column groups is 64 (i.e., $NUM_{CG}=63$). The column groups 20-0 through 20-$NUM_{CG}$ are desirable in most applications in order to provide the highest cell density by sharing sense amplifiers, write circuits, output latches and drivers, etc., as will be appreciated by one of ordinary skill in the art. However, it should also be appreciated that column groups are not necessary.

The column groups 20-0 through 20-$NUM_{CG}$ have corresponding test sense circuitry 22-0 through 22-$NUM_{CG}$ connected to the BLs and BLNs. More specifically, the test sense circuitry 22-0 includes NOR gates 24-0 through 24-NC (which are illustrated as equivalent inverted-input AND gates) and an OR gate 26-0 connected as shown. The NOR gate 24-0 has a first input connected to the BL of the column 18-0 and a second input connected to the BLN of the column 18-0. Likewise, the NOR gate 24-1 has a first input connected to the BL of the column 18-1 and a second input connected to the BLN of the column 18-1, and the NOR gate 24-NC has a first input connected to the BL of the column 18-NC and a second input connected to the BLN of the column 18-NC. The outputs of the NOR gates 24-0 through 24-NC are provided as inputs to the OR gate 26-0. As discussed below in detail, after a parallel read operation at the end of parallel testing, the BL and BLN for any one column in the column group 20-0 are both logic low only when one or more of the SRAM cells 14 in that column have failed the test. As such, an output of the OR gate 26-0, which is referred to herein as a column group fail signal, is logic high when any one or more of the SRAM cells 14 in the columns 18-0 through 18-NC in the column group 20-0 have failed the test. In a similar manner, the test sense circuitry 22-$NUM_{CG}$ includes NOR gates 24-(M-NC) through 24-M and an OR gate 26-$NUM_{CG}$ connected as shown. After a parallel read operation at the end of parallel testing, an output of the OR gate 26-$NUM_{CG}$ is logic high when any one or more of the SRAM cells 14 in the columns 18-(M-NC) through 18-M in the column group 20-$NUM_{CG}$ fail a test.

Figure 1:
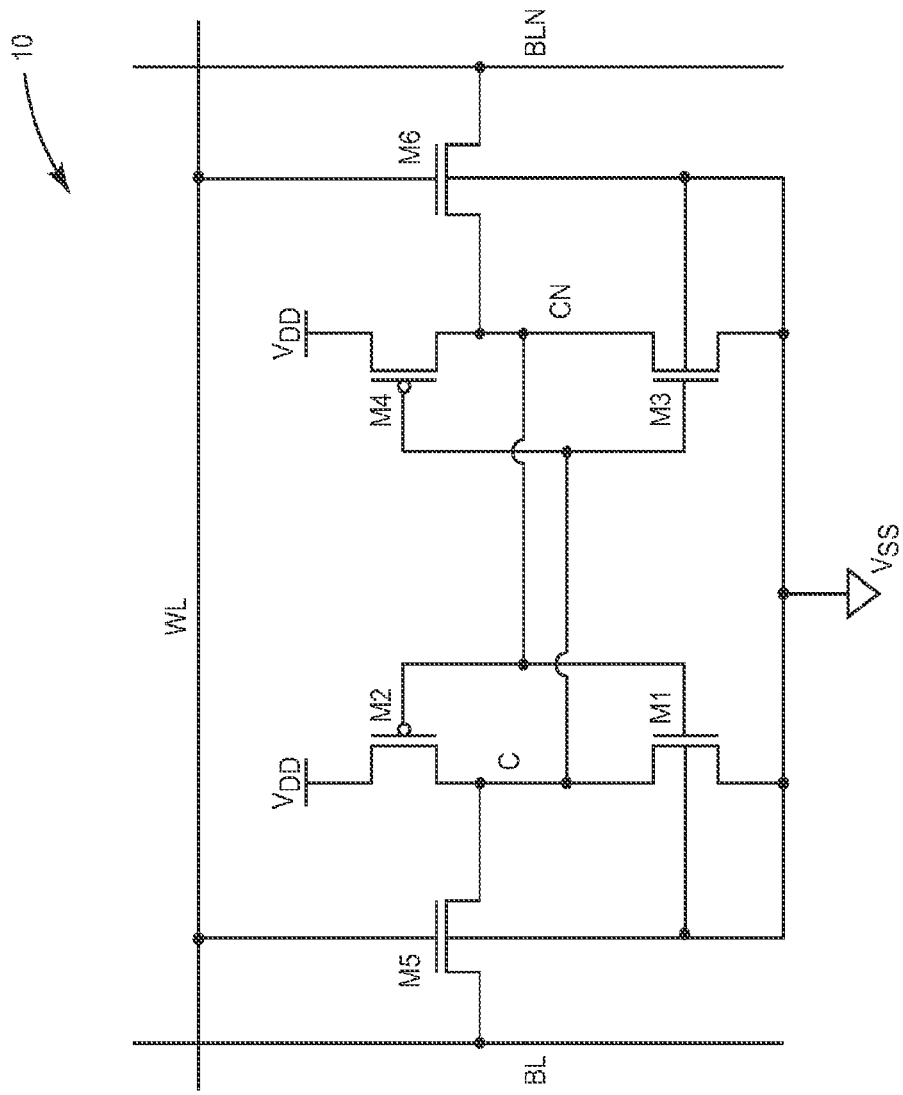
FIG. 1 illustrates a conventional Static Random Access Memory (SRAM) cell.
Figure 3:
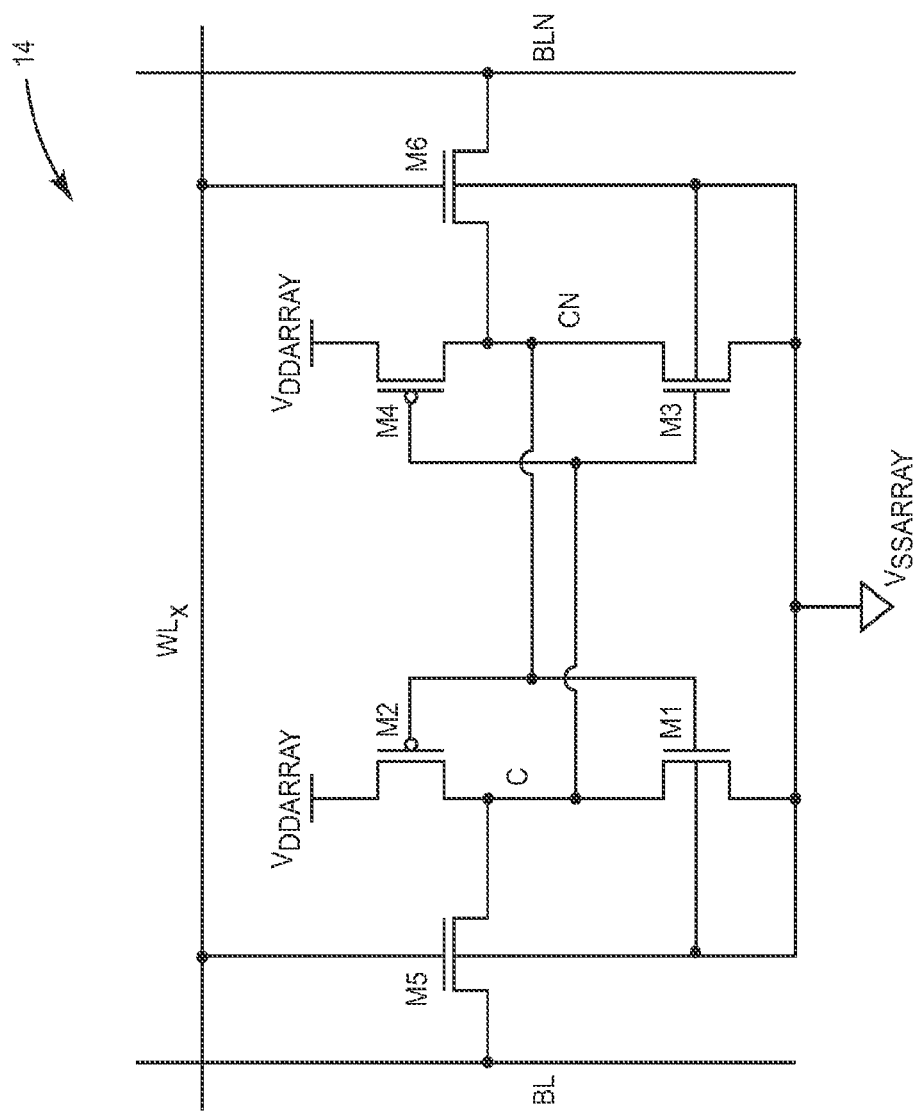
FIG. 3 illustrates one of the SRAM cells in the SRAM bank of FIG. 2 according to one embodiment of the present disclosure.

FIG. 3 illustrates one of the SRAM cells 14 of FIG. 2 in more detail according to one embodiment of the present disclosure. This SRAM cell 14 is substantially the same as the conventional SRAM cell 10 illustrated in and described with respect to FIG. 1. However, notably, reference voltages $V_{DDARRAY}$ and $V_{SSARRAY}$ supplied to the SRAM cell 14 may be variable in some embodiments. For example, the reference voltage $V_{DDARRAY}$ may be set to a high baseline reference voltage for the SRAM bank 12, which is referred to herein as $V_{DD}$, during normal operation and set to a voltage that is either less than or greater than $V_{DD}$ during testing, as described below in detail. Note that while the present disclosure focuses on a 6 transistor (6-T) architecture of the SRAM cells 14, it is not limited thereto. Other SRAM cell architectures may alternatively be used. In addition, while the present disclosure focuses on SRAM, the concepts disclosed herein may also be applicable to other types of memory.

Figure 4:
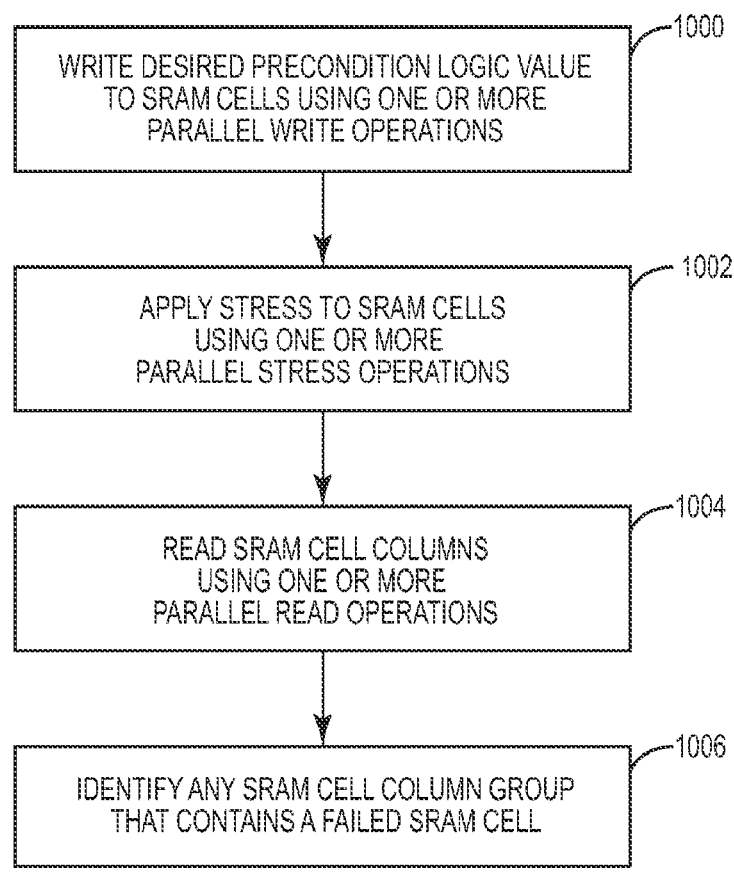
FIG. 4 illustrates a process for testing SRAM cells, such as the SRAM cells in the SRAM bank of FIG. 2, via parallel test operations according to one embodiment of the present disclosure.

FIG. 4 illustrates a process for testing the SRAM cells 14 in the SRAM bank 12 of FIG. 2 via parallel test operations according to one embodiment of the present disclosure. First, a desired precondition logic value is written to the SRAM cells 14 using one or more parallel write operations (step 1000). Depending on the particular test to be performed, the desired precondition logic value may be either a logic "1" or a logic "0." In one embodiment, if the desired precondition logic value is a logic "1," the desired precondition logic value is written to the SRAM cells 14 by simultaneously asserting all of the word lines $WL_0$ through $WL_N$ high while driving the BLNs for all of the columns 18-0 through 18-M to a voltage level corresponding to a logic "0." In this manner, the desired precondition logic value is simultaneously written to all of the SRAM cells 14 in the SRAM bank 12. Conversely, if the desired precondition logic value is a logic "0," in one embodiment, the desired precondition logic value is written to the SRAM cells 14 by simultaneously asserting all of the word lines $WL_0$ through $WL_N$ while driving the BLs for all of the columns 18-0 through 18-M to a voltage level corresponding to a logic "0." In this manner, the desired precondition logic value is simultaneously written to all of the SRAM cells 14 in the SRAM bank 12. Note that a voltage to which the word lines $WL_0$ through $WL_N$ are asserted when writing the desired precondition logic value to the SRAM cells 14 may be increased as compared to that used for normal write operations (i.e., when writing a single SRAM cell 14) to force writes into SRAM cells 14 that may have insufficient write margins and/or to enhance the relative write driver drive strength.

In another embodiment, multiple parallel write operations may be used to write the desired precondition logic value to the SRAM cells 14 in the SRAM bank 12. Each parallel write operation writes the desired precondition logic value to two or more different rows and two or more, but preferably all, of the columns of the SRAM cells 14 in the SRAM bank 12. More specifically, as an example, if there are 1024 rows, a separate parallel write operation may be performed for, as an example, each group of 16 rows. Therefore, a first parallel write operation may be performed by simultaneously asserting word lines $WL_0$ to $WL_{15}$ high while driving the BLs for all of the columns 18-0 through 18-M to a voltage level corresponding to the desired precondition logic value and/or driving the BLNs for all of the columns 18-0 through 18-M to a voltage level corresponding to the complement of the desired precondition logic value. In this manner, the desired precondition logic value is simultaneously written to all of the SRAM cells 14 in rows 16-0 through 16-15 of the SRAM bank 12. This process is then repeated for rows 16-16 through 16-31, rows 16-32 through 16-47, etc. until the desired precondition logic value has been written to all of the SRAM cells 14 in the SRAM bank 12.

Optionally, in some embodiments, a stress is applied to the SRAM cells 14 in the SRAM bank 12 using one or more parallel stress operations (step 1002). The particular type of stress depends on the test to be performed. For this discussion, the test to be performed is either a write margin test, a read static noise margin (SNM) test, or a hold margin test. In general, before the stress is applied, the SRAM cells 14 all store the desired precondition logic value (e.g., C="1" and CN="0"). After the one or more parallel stress operations are performed, the SRAM cells 14 should all store the same value (e.g., C="1" and CN="0" or C="0" and CN="1" depending on whether the stress should have flipped the state of the SRAM cells 14). To stress the RAM, the word lines $WL_0$ through $WL_N$ may be asserted to $V_{DD}$ or asserted to a voltage less than $V_{DD}$ so as to provide insufficient write margin to write the SRAM cells 14.

Next, the columns 18-0 through 18-M of the SRAM cells 14 are read using one or more parallel read operations (step 1004). More specifically, as discussed below in detail, in one embodiment, all of the BLs and BLNs are precharged to a voltage level (e.g., $V_{DD}$) corresponding to a logic "1." Then, all of the word lines $WL_0$ through $WL_N$ are simultaneously asserted high to simultaneously read all of the columns 18-0 through 18-M. Normally, if all of the SRAM cells 14 in a column pass the test, then the BL and BLN for the column will be at complementary logic values (e.g., BL="1" and BLN="0" or vice versa). However, if one or more SRAM cells 14 in a column fail the test, then both the BL and BLN for that column will be discharged to a logic "0" during the parallel read operation. For instance, if the output nodes C of the SRAM cells 14 in the column 18-0 should all be at a logic "1" after the stress but one of the SRAM cells 14 in the column 18-0 fails the test (i.e., C="0" after the stress), then the BL for the column 18-0 will be discharged to a logic "0" by the pull-down transistor M1 of the SRAM cell 14 that failed the test. As a result, both the BL and the BLN of the column 18-0 will read as a logic "0" during step 1004, which indicates that one or more of the SRAM cells 14 in the column 18-0 failed the test.

Lastly, any of the columns groups 20-0 through 20-$NUM_{CG}$ that include one or more SRAM cells 14 that failed the test are identified (step 1006). More specifically, any of the column groups 20-0 through 20-$\text{NUM}_{CG}$ that include one or more SRAM cells 14 that failed the test are identified by examining the outputs of the OR gates 26-0 through 26-$\text{NUM}_{CG}$. Any OR gate 26-0 through 26-$\text{NUM}_{CG}$ having a high output indicates that the corresponding column group 20-0 through 20-$\text{NUM}_{CG}$, respectively, includes one or more SRAM cells 14 that failed the test. Notably, in addition to or as an alternative to identifying any of the column groups 20-0 through 20-$\text{NUM}_{CG}$ that include one or more SRAM cells 14 that failed the test, any of the columns 18-0 through 18-M that include one or more SRAM cells 14 that failed the test may be identified by examining the outputs of the NOR gates 24-0 through 24-M. Still further, the particular SRAM cell(s) 14 that failed the test may be identified using binary search or other techniques to identify the row, in addition to the column, of the failed SRAM cell(s) 14. The failed column group, column, or SRAM cell 14 may be eliminated or bypassed using conventional redundancy techniques.

Before proceeding, it should be noted that while the process of FIG. 4 first writes all of the SRAM cells 14 in the SRAM bank 12, then optionally stresses all of the SRAM cells 14 in the SRAM bank 12, and then reads all of the columns 18-0 through 18-M in the SRAM bank 12, the process is not limited thereto. For instance, the process of FIG. 4 may alternatively be performed on a block-by-block basis such that steps 1000 through 1006 are performed for a first block of the SRAM cells 14, then for a next block of the SRAM cells 14, and so on until all of the SRAM cells 14 in the SRAM bank 12 have been tested. Further, it should be noted that if a particular integrated circuit includes multiple SRAM banks 12, the SRAM banks 12 may also be tested in parallel.

Figure 5:
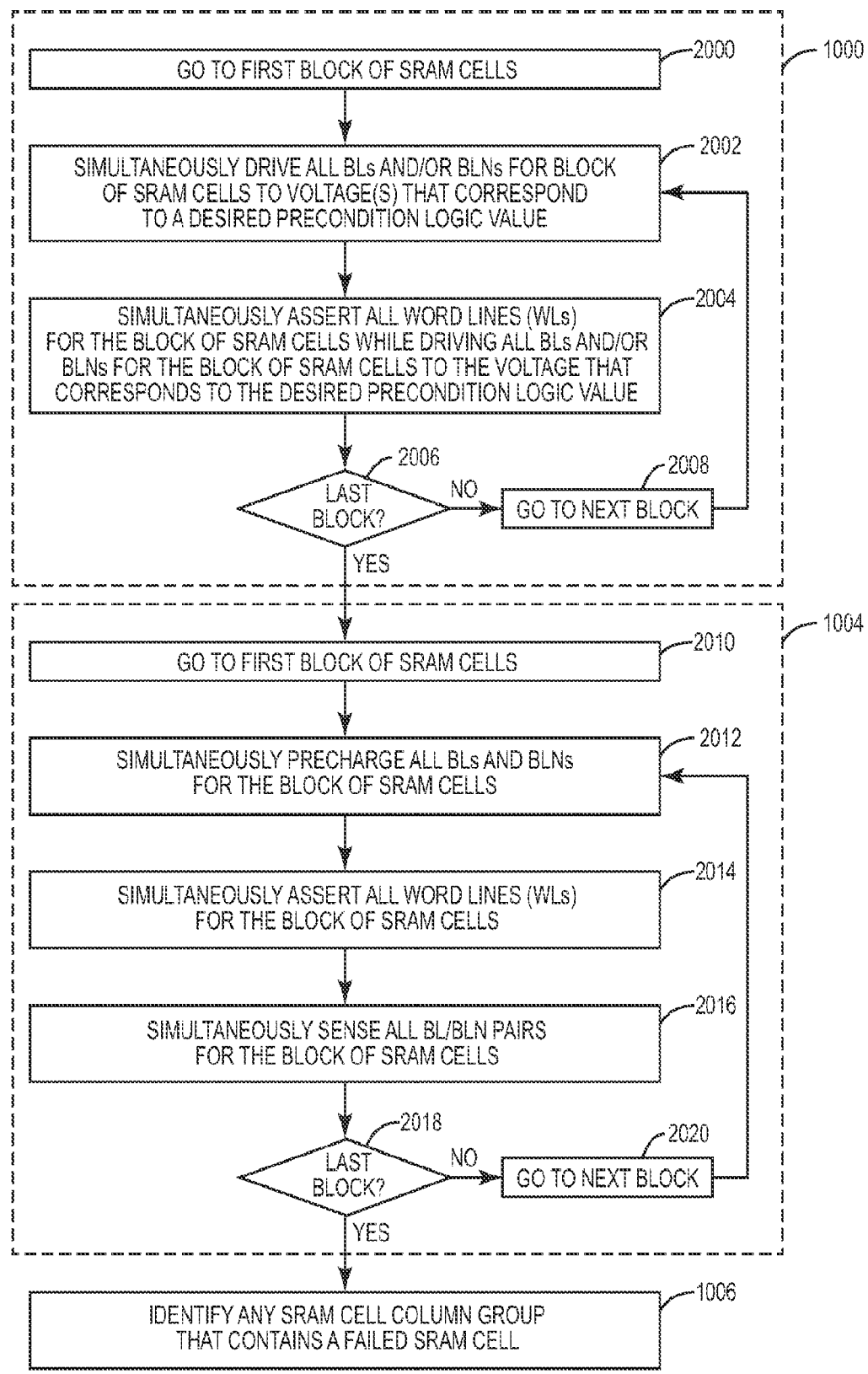
FIG. 5 is a more detailed illustration of the process of FIG. 4 according to one embodiment of the present disclosure.

FIG. 5 illustrates the process of FIG. 4 in more detail according to one embodiment of the present disclosure. Notably, in this embodiment, no stress is applied to the SRAM cells 14. Rather, this process tests for SRAM cells 14 that are "stuck at" a particular logic value (i.e., always at a logic "0" and unable to be written to a logic "1" or vice versa). In this embodiment, the parallel test operations are performed on blocks of SRAM cells 14 in the SRAM bank 12. Each block includes SRAM cells 14 in two or more of the rows 16-0 through 16-N, SRAM cells 14 in two or more of the columns 18 in the same column group 20 (e.g., two or more of the columns 18-0 through 18-NC in the column group 20-0), or both SRAM cells 14 in two or more of the rows 16-0 through 16-N and SRAM cells 14 in two or more of the columns 18 in the same column group 20. Further, as used herein, a "block" of SRAM cells 14 preferably includes SRAM cells 14 from two or more adjacent rows and/or two or more adjacent columns, but is not limited thereto. A "block" of SRAM cells 14 may include SRAM cells 14 in adjacent and/or non-adjacent rows and/or SRAM cells 14 in adjacent or non-adjacent columns. In one example, a block of the SRAM cells 14 includes all of the SRAM cells 14 in a predefined number of two or more of the rows 16-0 through 16-N.

First, in order to write a desired precondition logic value to the SRAM cells 14, the write process begins with a first block of the SRAM cells 14 (step 2000). Then, all BLs and/or BLNs of the SRAM cells 14 in the block are driven to voltage(s) corresponding to a desired precondition logic value (step 2002). More specifically, in one embodiment, if the desired precondition logic value is a logic "0," then all of the BLs of the SRAM cells 14 in the block are driven to a low reference voltage (e.g., baseline $V_{SS}$). Conversely, if the desired precondition logic value is a logic "1," then all of the BLNs of the SRAM cells 14 in the block are driven to the low reference voltage. All of the word lines (WLs) for the block of SRAM cells 14 are simultaneously asserted while the BLs (or conversely BLNs) of the SRAM cells 14 in the block are driven to the voltage corresponding to the desired precondition logic value (step 2004). A determination is then made if the last block of the SRAM cells 14 has been written (step 2006). If not, the write process proceeds to the next block of the SRAM cells 14 (step 2008), and the process returns to step 2002. Notably, by using parallel write operations, the amount of time taken to write the desired precondition logic value to the SRAM cells 14 in the SRAM bank 12 is substantially reduced. As an example, if the SRAM bank 12 includes 256 rows and 256 columns and 16 world lines (WLs) are asserted in each parallel write operation, then the entire SRAM bank 12 can be written to the desired precondition logic value in 16 cycles (256 rows/16 rows per cycle=16 cycles). This is a 128× improvement over conventional approaches that do not use parallel write operations.

After the desired precondition logic value has been written to all of the SRAM cells 14 in the SRAM bank 12, the columns 18-0 through 18-M of the SRAM cells 14 are read to determine whether any of the column groups 20-0 through 20-$\text{NUM}_{CG}$ and/or any of the columns 18-0 through 18-M include one or more SRAM cells 14 that were unable to be written (i.e., are "stuck at" the complement of the desired precondition logic value). More specifically, the read process begins with a first block of the SRAM cells 14 (step 2010). All BLs and BLNs of the SRAM cells 14 in the block are simultaneously precharged to a voltage (e.g., $V_{DD}$) corresponding to a logic "1" (step 2012). Then, all of the word lines (WLs) of the SRAM cells 14 in the test block are simultaneously asserted (step 2014). As a result, any SRAM cell 14 in the block that stores a logic "0" at the output node C will discharge the corresponding BL. Likewise, any SRAM cell 14 in the block that stores a logic "0" at the complementary output node CN will discharge the corresponding BLN. Because of the preconditioning, all of the SRAM cells 14 should store the same logic value (i.e., the desired precondition logic value). Any SRAM cell 14 that is "stuck at" the complement of the desired precondition logic value and was therefore unable to be written with the desired precondition logic value will result in both the BL and BLN for the corresponding column to be discharged to a logic "0." All BL/BLN pairs for the SRAM cells 14 in the test block are then sensed by the corresponding NOR gates 24-0 through 24-M (step 2016). A determination is then made as to whether the last test block of the SRAM cells 14 has been read (step 2018). If not, the read process proceeds to the next test block of the SRAM cells 14 (step 2020), and the process returns to step 2012 and is repeated. Notably, by using parallel read operations, the amount of time taken to read the SRAM cells 14 in the SRAM bank 12 is substantially reduced. As an example, if the SRAM bank 12 includes 256 rows and 256 columns and 16 word lines (WLs) are asserted in each parallel read operation, the then entire SRAM bank 12 can be read in 16 cycles (256 rows/16 rows per cycle=16 cycles). This is a 128× improvement over conventional approaches that do not use parallel read operations.

Once all of the test blocks have been read, any of the column groups 20-0 through 20-$\text{NUM}_{CG}$ that include one or more SRAM cells 14 that failed the test are identified by examining the outputs of the OR gates 26-0 through 26-$\text{NUM}_{CG}$ (step 1006). In this embodiment, the SRAM cells 14 that failed the test are those SRAM cells 14 that were unable to be written in steps 2010 through 2020, which resulted in both the BL and the BLN for the corresponding column to be read at a logic "0."

As an example, if the desired precondition logic value is "1," then, at the end of the read operation, all BLs of the SRAM cells 14 in the SRAM bank 12 will be at a logic "1"

unless they are stuck at logic "0." Thus, using the column 18-0 as a specific example, if one of SRAM cells 14 in the column 18-0 is stuck at a logic "0" and therefore unable to be written in steps 2000 through 2008, then the SRAM cell 14 that is stuck at a logic "0" will result in the BL of the SRAM cells 14 in column 18-0 being pulled low through the pull-down transistor M1 of that SRAM cell 14. As a result, both the BL and the BLN of the column 18-0 will be sensed as a logic "0," which in turn results in a logic "1" at the output of the corresponding NOR gate 24-0 and a logic "1" at the output of the corresponding OR gate 26-0. The logic "1" at the output of the NOR gate 24-0 indicates that one or more of the SRAM cells 14 in the column 18-0 failed the test, and the logic "1" at the output of the OR gate 26-0 indicates that one or more SRAM cells 14 in the corresponding column group 20-0 failed the test.

Figure 6:
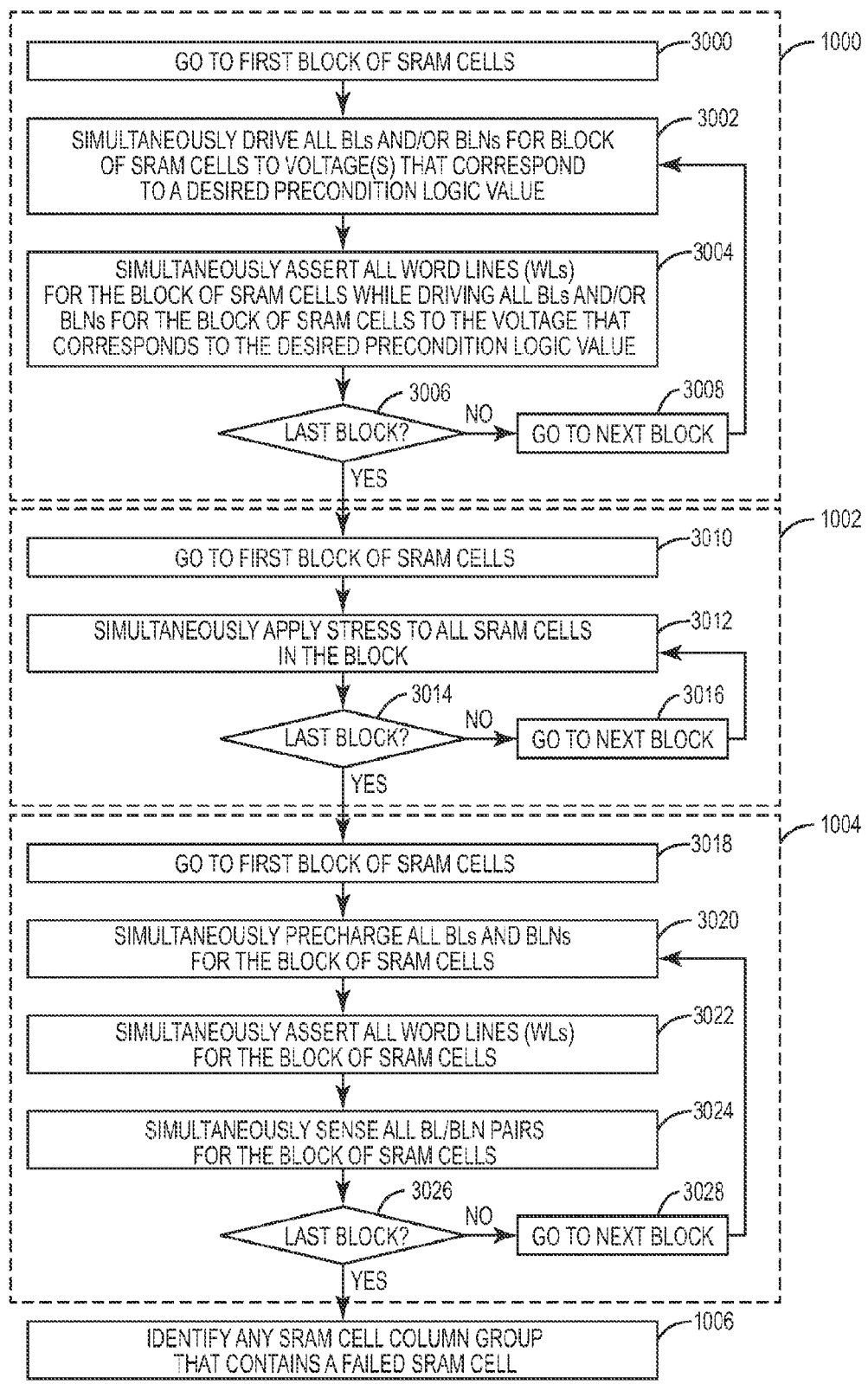
FIG. 6 is a more detailed illustration of the process of FIG. 4 according to another embodiment of the present disclosure.

FIG. 6 illustrates the process of FIG. 4 in more detail according to another embodiment of the present disclosure. Notably, in this embodiment, a stress is applied to the SRAM cells 14 to test for write margin, read SNM, or hold margin. Again, in this embodiment, the parallel test operations are performed on blocks of SRAM cells 14 in the SRAM bank 12. Each block includes SRAM cells 14 in two or more of the rows 16-0 through 16-N, SRAM cells 14 in two or more of the columns 18 in the same column group 20 (e.g., two or more of the columns 18-0 through 18-NC in the column group 20-0), or both SRAM cells 14 in two or more of the rows 16-0 through 16-N and SRAM cells 14 in two or more of the columns 18 in the same column group 20. Further, as used herein, a "block" of SRAM cells 14 preferably includes SRAM cells 14 from two or more adjacent rows and/or two or more adjacent columns, but is not limited thereto. A "block" of SRAM cells 14 may include SRAM cells 14 in adjacent and/or non-adjacent rows and/or SRAM cells 14 in adjacent or non-adjacent columns. In one example, a block of the SRAM cells 14 includes all of the SRAM cells 14 in a predefined number of two or more of the rows 16-0 through 16-N.

First, in order to write a desired precondition logic value to the SRAM cells 14, the write process begins with a first block of the SRAM cells 14 (step 3000). Then, all BLs and/or BLNs of the SRAM cells 14 in the block are driven to voltage(s) corresponding to a desired precondition logic value (step 3002). More specifically, in one embodiment, if the desired precondition logic value is a logic "0," then all of the BLs of the SRAM cells 14 in the block are driven to a low reference voltage (e.g., baseline $V_{SS}$). Conversely, if the desired precondition logic value is a logic "1," then all of the BLNs of the SRAM cells 14 in the block are driven to the low reference voltage. All of the word lines (WLs) for the block of SRAM cells 14 are simultaneously asserted while the BLs (or conversely BLNs) of the SRAM cells 14 in the block are driven to the voltage corresponding to the desired precondition logic value (step 3004). A determination is then made if the last block of the SRAM cells 14 has been written (step 3006). If not, the write process proceeds to the next block of the SRAM cells 14 (step 3008), and the process returns to step 3002. Notably, by using parallel write operations, the amount of time taken to write the desired precondition logic value to the SRAM cells 14 in the SRAM bank 12 is substantially reduced. As an example, if the SRAM bank 12 includes 256 rows and 256 columns and 16 word lines (WLs) are asserted in each parallel write operation, then the entire SRAM bank 12 can be written to the desired precondition logic value in 16 cycles (256 rows/16 rows per cycle=16 cycles). This is a 128× improvement over conventional approaches that do not use parallel write operations.

After the desired precondition logic value has been written to all of the SRAM cells 14 in the SRAM bank 12, a stress is applied to the SRAM cells 14 using a number of parallel stress operations. More specifically, the stress process begins with a first block of SRAM cells 14 (step 3010). A stress is simultaneously applied to the SRAM cells 14 in the block (step 3012). The particular type of stress may vary depending on the type of test being performed and the particular implementation. A number of exemplary stress operations are discussed below.

Write margin is defined as the bit line voltage ($V_{BL}$) required to flip the SRAM cell 14 by keeping one bit line high and lowering the other bit line from $V_{DD}$ towards $V_{SS}$ until the cell state is flipped. In other words, write margin is defined as how low a bit line voltage ($V_{BL}$) of the BLs, or conversely the BLNs, must be in order to write the SRAM cells 14. The write margin of the SRAM cell 14 is affected by the relative strength ratio of the access transistor M5 or M6 to the PMOS pull-up transistor M2 or M4. To provide adequate write margin, the access transistors M5 and M6 need to be stronger than the PMOS pull-up transistors M2 and M4.

The stress applied to test the write margin of the SRAM cells 14 in the SRAM bank 12 may vary. In one embodiment, the stress applied to the SRAM cells 14 in order to test write margin is lowering a word line voltage ($V_{WL}$) of the asserted word lines (WLs) to a voltage that is less than $V_{DDARRAY}$ while attempting to write a logic value that is the complement of the desired precondition logic value to the SRAM cells 14 (i.e., attempting to flip the state of the SRAM cells 14). In order to test for SRAM cells 14 that are too weak, or too easily written, the word line voltage ($V_{WL}$) may be lowered to a value that should be insufficient for the state of the SRAM cells 14 to be flipped by the write operation if the SRAM cells 14 have the desired write margin. Alternatively, in order to test for SRAM cells 14 that are too strong, or too difficult to write, the word line voltage ($V_{WL}$) may be lowered but only to a value that should still be sufficient for the state of the SRAM cells 14 to be flipped by the write operation if the SRAM cells 14 have the desired write margin.

More specifically, assuming that the desired precondition logic value, which has already been applied, is "0," the BLNs of all of the SRAM cells 14 in the block are all simultaneously driven to a baseline low reference voltage $V_{SS}$ (e.g., ground) while simultaneously asserting all of the word lines (WLs) for the block to $V_{WL} < V_{DDARRAY}$. In contrast, if the desired precondition logic value is "1," the BLs of all of the SRAM cells 14 in the block are all simultaneously driven to $V_{SS}$ while simultaneously asserting all of the word lines (WLs) for the block to $V_{WL} < V_{DDARRAY}$. The word line voltage ($V_{WL}$) is less than $V_{DDARRAY}$ by a predetermined amount. In order to test for SRAM cells 14 that are too weak (i.e., too easily written), the word line voltage ($V_{WL}$) is low enough that the SRAM cells 14 in the test block should not be written (i.e., should not be flipped from the desired precondition logic value to its complement). Any of the SRAM cells 14 that are flipped are SRAM cells 14 that failed the write margin test. In order to test for SRAM cells 14 that are strong (i.e., too difficult to write), the word line voltage ($V_{WL}$) is less than $V_{DDARRAY}$ but high enough that the SRAM cells 14 in the test block should be written (i.e., should be flipped from the desired precondition logic value to its complement). Any of the SRAM cells 14 in the test block that are not flipped are SRAM cells 14 that failed the write margin test.

In another embodiment, the stress applied to the SRAM cells 14 in order to test write margin is raising $V_{DDARRAY}$ above a precharge voltage ($V_{PRECH}$), which is also the word line voltage ($V_{WL}$) of the asserted word lines (WLs), while attempting to write a logic value that is the complement of the desired precondition logic value to the SRAM cells 14 (i.e., attempting to flip the state of the SRAM cells 14). In order to test for SRAM cells 14 that are too weak, or too easily written, $V_{DDARRAY}$ may be raised to a value that should prevent the state of the SRAM cells 14 from being flipped by the write operation. Alternatively, in order to test for SRAM cells 14 that are too strong, or too difficult to write, $V_{DDARRAY}$ may be raised to a level that is above $V_{PRECH}$ and $V_{WL}$ but that is low enough that the state of the SRAM cells 14 should be flipped by the write operation.

More specifically, assuming that the desired precondition logic value, which has already been applied, is "0," the BLNs of all of the SRAM cells 14 in the test block are all simultaneously driven to $V_{SS}$ (e.g., ground). In contrast, if the desired precondition logic value is "1," the BLs of all of the SRAM cells 14 in the test block are all simultaneously driven to $V_{SS}$. All of the word lines (WLs) for the SRAM cells 14 in the block are asserted while $V_{DDARRAY}$ is set to a voltage that is greater than $V_{WL}$. In order to test for SRAM cells 14 that are weak (i.e., too easily written), $V_{DDARRAY}$ is set high enough that the SRAM cells 14 in the test block should not be written (i.e., should not be flipped from the desired precondition logic value to its complement). Any of the SRAM cells 14 that are flipped are SRAM cells 14 that failed the write margin test. In order to test for SRAM cells 14 that are strong (i.e., too difficult to write), $V_{DDARRAY}$ is set greater than $V_{WL}$ but low enough that the SRAM cells 14 in the test block should be written (i.e., should be flipped from the desired precondition logic value to its complement). Any of the SRAM cells 14 in the test block that are not flipped are SRAM cells 14 that failed the write margin test.

In another embodiment, the stress applied to the SRAM cells 14 in order to test write margin is raising a low bit line voltage ($V_{BL}$) applied to the bit lines (BLs or BLNs) for write operations, which may alternatively be referred to as $V_{WRITE}$ or $V_{SSWR}$, above $V_{SS}$ while attempting to write a logic value that is the complement of the desired precondition logic value to the SRAM cells 14 (i.e., attempting to flip the state of the SRAM cells 14). In order to test for SRAM cells 14 that are too weak, or too easily written, $V_{BL}$ may be raised to a value that should prevent the state of the SRAM cells 14 from being flipped by the write operation. Alternatively, in order to test for SRAM cells 14 that are too strong, or too difficult to write, $V_{BL}$ may be raised to a level that is above $V_{SS}$ but that is low enough that the state of the SRAM cells 14 should be flipped by the write operation. Note that the latter provides direct measurement of the SRAM cell write margins.

More specifically, assuming that the desired precondition logic value, which has already been applied, is "0," the BLNs of all of the SRAM cells 14 in the block are all simultaneously driven to $V_{BL}$, where $V_{BL} > V_{SS}$ (e.g., $V_{SS}$+100 mV) while all of the word lines (WLs) of the SRAM cells 14 in the block are asserted. In contrast, if the desired precondition logic value is "1," the BLs of all of the SRAM cells 14 in the block are all simultaneously driven to $V_{BL}$, where $V_{BL} > V_{SS}$ (e.g., $V_{SS}$+100 millivolts (mV)) while all of the word lines (WLs) for the SRAM cells 14 in the block are asserted. In order to test for SRAM cells 14 that are weak (i.e., too easily written), $V_{BL}$ is high enough that the SRAM cells 14 in the block should not be written (i.e., should not be flipped from the desired precondition logic value to its complement). Any of the SRAM cells 14 that are flipped are SRAM cells 14 that failed the write margin test. In order to test for SRAM cells 14 that are strong (i.e., too difficult to write), $V_{BL}$ is greater than $V_{SS}$ but low enough that the SRAM cells 14 in the block should be written (i.e., should be flipped from the desired precondition logic value to its complement). Any of the SRAM cells 14 in the block that are not flipped are SRAM cells 14 that failed the write margin test. Notably, any of the stress conditions discussed above to test write margin may be used alone or in combination with one another.

Read SNM is related to what precharge voltage ($V_{PRECH}$) may cause the SRAM cell 14 to upset. Basically, a voltage divider of the pull-down transistor M1 or M3 and the access transistor M5 or M6 should not raise a low voltage on the output node C or CN of the SRAM cell 14 storing a logic "0" above some predetermined voltage level (e.g., the metastable point). To provide read SNM, the access transistors M5 and M6 are weaker (i.e., have higher on-resistance than) the NMOS pull-down transistors M1 and M3.

In one embodiment, the stress applied to the SRAM cells 14 in order to test read SNM is attempting to read the SRAM cells 14 in the test block using a precharge voltage ($V_{PRECH}$) that is greater than $V_{DDARRAY}$ by an amount that should not upset the SRAM cells 14 (e.g., should not raise a low voltage level at either output node C or CN above the metastable point). More specifically, the BLs and BLNs of all of the SRAM cells 14 in the test block are all simultaneously precharged to $V_{PRECH}$, which is greater than $V_{DDARRAY}$. Then, all of the word lines (WLs) for the SRAM cells 14 in the test block are asserted. If the desired precondition logic value is "1," then the voltage level at the complementary output nodes (CNs) of the SRAM cells 14 in the test block should remain at a logic level "0." However, for any SRAM cells 14 that have insufficient read SNM, the voltage level at the complementary output node (CN) will increase to a level that is no longer a logic level "0," i.e., crosses the logic threshold of the driven feedback inverter, which causes those SRAM cells 14 to flip, or change states. Likewise, if the desired precondition logic value is "0," then the voltage level at the output nodes (Cs) of the SRAM cells 14 in the test block should remain at a logic level "0." However, for any SRAM cells 14 that have insufficient read SNM, the voltage level at the output node (C) will increase to a level that is no longer a logic level "0," which causes those SRAM cells 14 to flip.

Figure 7:
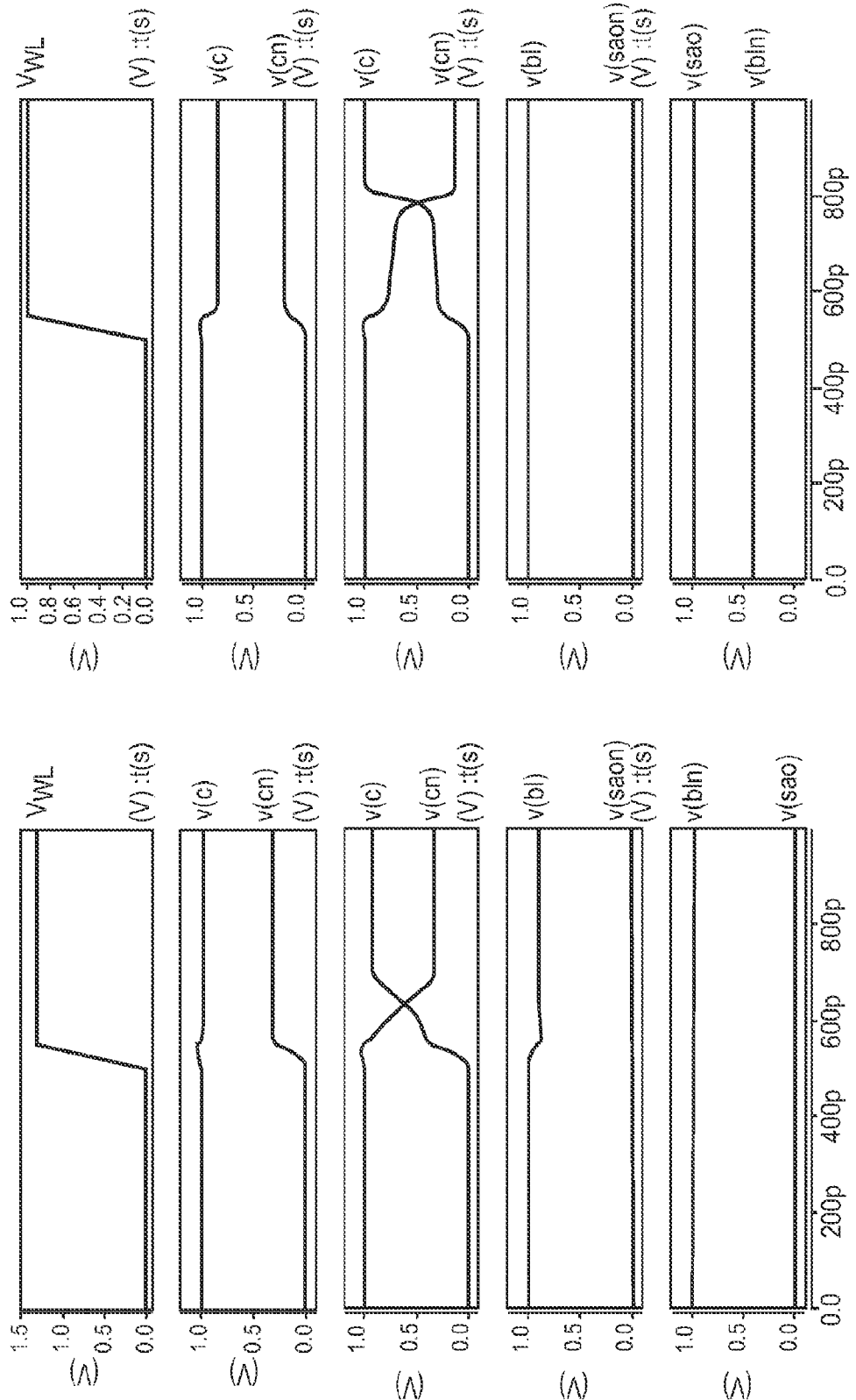
FIGS. 7A and 7B illustrate simulation results for testing SRAM cells with two particular types of stress conditions according to one embodiment of the present disclosure.

In another embodiment, the stress applied to the SRAM cells 14 in order to test read SNM is attempting to read the SRAM cells 14 in the test block while driving the word line voltage ($V_{WL}$) greater than $V_{DDARRAY}$. This increases a strength of the access transistors M5 and M6 of the SRAM cells 14 (i.e., decreases their on-resistance). As a result, due to the voltage divider formed by the access transistors M5 and M6 and the pull-down transistors M1 and M3, the voltage at the output node C or CN storing a logic level "0" increases toward instability. The word line voltage ($V_{WL}$) is increased above $V_{DDARRAY}$ by a predetermined amount that is sufficient to test for a desired read SNM. To apply the stress, the BLs and BLNs of all of the SRAM cells 14 in the test block are all simultaneously precharged to, for example, $V_{PRECH} = V_{DDARRAY}$. Then, all of the word lines (WLs) for the SRAM cells 14 in the test block are asserted to a $V_{WL}$ that is greater than $V_{DDARRAY}$. If the desired precondition logic value is "1," then the voltage level at the complementary output nodes (CNs) of the SRAM cells 14 in the test block should remain at a logic level "0." However, for any SRAM cells 14 that have insufficient read SNM, the voltage level at the complementary output node (CN) will increase to a level that is no longer a logic level "0," which will cause those SRAM cells 14 to flip. Likewise, if the desired precondition logic value is "0," then the voltage level at the output nodes (Cs) of the SRAM cells 14 in the test block should remain at a logic level "0." However, for any SRAM cells 14 that have insufficient read SNM, the voltage level at the output node (C) will increase to a level that is no longer a logic level "0," which will cause those SRAM cells 14 to flip. Simulation results for this particular test are shown in FIG. 7A.

In yet another embodiment, the stress applied to the SRAM cells 14 in order to test read SNM is attempting to read the SRAM cells 14 in the block while driving the $V_{DDARRAY}$ less than the word line voltage ($V_{WL}$), where $V_{WL}=V_{PRECH}=V_{DD}$. This decreases a strength of the pull-down transistors M1 and M3 (i.e., increases their on-resistance). As a result, due to the voltage divider formed by the access transistors M5 and M6 and the pull-down transistors M1 and M3, the voltage at the output node C or CN storing a logic level "0" increases toward instability. The reference voltage $V_{DDARRAY}$ is decreased below $V_{WL}=V_{PRECH}=V_{DD}$ by a predetermined amount that is sufficient to test for a desired read SNM. More specifically, the BLs and BLNs of all of the SRAM cells 14 in the block are all simultaneously precharged to $V_{PRECH}=V_{DD}$. Then, all of the word lines (WLs) for the SRAM cells 14 in the block are asserted to $V_{WL}=V_{DD}$ while driving $V_{DDARRAY}$ to a level that is less than $V_{DD}$. If the desired precondition logic value is "1," then the voltage level at the complementary output nodes (CNs) of the SRAM cells 14 in the test block should remain at a logic level "0." However, for any SRAM cells 14 that have insufficient read SNM, the voltage level at the complementary output node (CN) will increase to a level that is no longer a logic level "0," which will cause those SRAM cells 14 to flip. Likewise, if the desired precondition logic value is "0," then the voltage level at the output nodes (Cs) of the SRAM cells 14 in the block should remain at a logic level "0." However, for any SRAM cells 14 that have insufficient read SNM, the voltage level at the output node (C) will increase to a level that is no longer a logic level "0," which will cause those SRAM cells 14 to flip.

In yet another embodiment, the stress applied to the SRAM cells 14 in order to test read SNM is attempting to read the SRAM cells 14 in the test block with $V_{WL}=V_{DDARRAY}$ while driving the BL or BLN voltages between $V_{DD}$ and $V_{SS}$. More specifically, one of the BL and BLN is driven to a voltage that is less than $V_{DD}$ but greater than $V_{DD}/2$ while the other one of the BL and BLN is driven to a voltage that is greater than $V_{SS}$ but less than $V_{DD}/2$. Simulation results for this particular test are shown in FIG. 7B. Notably, any of the stress conditions discussed above to test read SNM may be used alone or in combination with one another.

In yet another embodiment, parallel stress operations may be used to test hold margin. For example, the stress to test for hold margin may be applied to the SRAM cells 14 driving both bit lines BL and BLN for the SRAM cells 14 in the block to the same voltage level where that voltage level is less than or equal to $V_{DDARRAY}$ while simultaneously asserting the word lines (WLs) for the SRAM cells 14 in the block to $V_{WL}>V_{DDARRAY}$. This test can be sped up by further increasing $V_{WL}$ above $V_{DDARRAY}$ (e.g., $V_{WL}>V_{DDARRAY}+100$ mV) and/or decreasing the voltage level of both the BLs and BLNs to a voltage less than $V_{DDARRAY}$ (e.g., less than $V_{DDARRAY}-100$ mV).

After applying the stress to the SRAM cells 14 in the test block, a determination is made as to whether the last test block has been tested (step 3014). If not, the stress operation proceeds to the next test block (step 3016), and the process then returns to step 3012. After stressing the SRAM cells 14 in the SRAM bank 12, the columns 18-0 through 18-M of the SRAM cells 14 are read to determine whether any of the column groups 20-0 through 20-$\text{NUM}_{CG}$ and/or any of the columns 18-0 through 18-M include one or more SRAM cells 14 that failed the test (e.g., have insufficient write margin or insufficient read SNM). More specifically, the read process begins with a first block of the SRAM cells 14 (step 3018). All BLs and BLNs of the SRAM cells 14 in the block are simultaneously precharged to a voltage (e.g., $V_{DD}$) corresponding to a logic "1" (step 3020). Then, all of the word lines (WLs) of the SRAM cells 14 in the block are simultaneously asserted (step 3022). All BL/BLN pairs for the SRAM cells 14 in the block are then sensed by the corresponding NOR gates 24 (step 3024). A determination is then made as to whether the last block of the SRAM cells 14 has been read (step 3026). If not, the read process proceeds to the next block of the SRAM cells (step 3028), and the process returns to step 3020 and is repeated. Once all of the blocks have been read, any of the column groups 20-0 through 20-$\text{NUM}_{CG}$ that include one or more SRAM cells 14 that failed the test are identified by examining the outputs of the OR gates 26-0 through 26-$\text{NUM}_{CG}$ (step 1006).

As an example, at the end of the read operation, all BLs of the SRAM cells 14 in the SRAM bank 12 should be at the same logic value (e.g., logic "1") and all of the BLNs of the SRAM cells 14 in the SRAM bank 12 should be at the complementary logic value (e.g., logic "0"). Thus, using column 18-0 as a specific example, if one of SRAM cells 14 in the column 18-0 failed the test, then both the BL and the BLN for column 18-0 will be logic "0," which in turn results in a logic "1" at the output of the corresponding NOR gate 24-0 and a logic "1" at output of the corresponding OR gate 26-0. The logic "1" at the output of the NOR gate 24-0 indicates that one or more of the SRAM cells 14 in the column 18-0 failed the test, and the logic "1" at the output of the OR gate 26-0 indicates that one or more SRAM cells 14 in the corresponding column group 20-0 failed the test.

Figure 8:
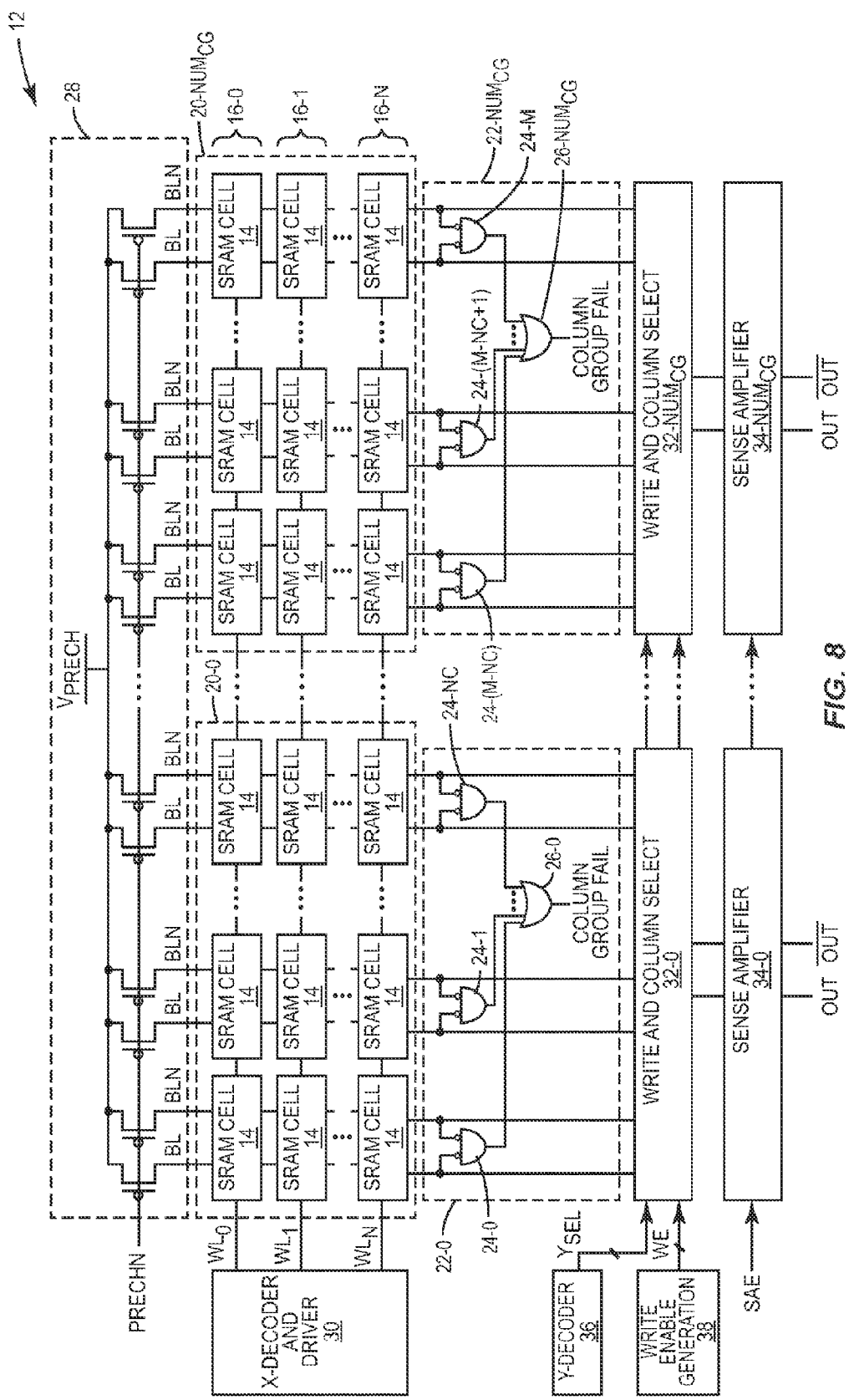
FIG. 8 illustrates the SRAM bank of FIG. 2 along with various peripheral circuitry configured to enable parallel testing of the SRAM cells in the SRAM bank according to one embodiment of the present disclosure.

FIG. 8 illustrates the SRAM bank 12 of FIG. 2 along with a number of peripheral circuits that enable parallel operations to be performed on the SRAM cells 14 in the SRAM bank 12 according to one embodiment of the present disclosure. More specifically, precharge circuitry 28 operates to precharge the bit lines (BLs) and bit line nots (BLNs) of the SRAM cells 14 to the precharge voltage ($V_{PRECH}$) under control of a precharge control signal (PRECHN). The precharge voltage ($V_{PRECH}$) may be a static voltage such as, for example, $V_{DD}$ or a variable voltage that, for example, may be coupled to $V_{DD}$ during normal operation and separable from $V_{DD}$ during testing (e.g., less than or greater than $V_{DD}$ during testing). In this embodiment, the precharge circuitry 28 includes a number of PMOS transistors that are connected as shown. Thus, when the precharge control signal (PRECHN) is asserted low, the PMOS transistors are turned on such that the BLs and BLNs are precharged to $V_{PRECH}$.

X-decoder and driver circuitry 30 operates to generate the word line (WL) signals. In normal operation (i.e., normal read or write operations), the X-decoder and driver circuitry 30 asserts only one word line (WL). However, in test mode, the X-decoder and driver circuitry 30 asserts multiple word lines (WLs), and in some embodiments all of the word lines (WLs), simultaneously in order to perform parallel test operations.

Write and column select circuitry 32-0 through 32-$\text{NUM}_{CG}$ generally operate to control the bit line voltages during normal write operations and, in some embodiments, during test operations. In addition, the write and column select circuitry 32-0 through 32-$\text{NUM}_{CG}$ operate to select desired columns 18-0 through 18-M to output to sense amplifiers 34-0 through 34-$\text{NUM}_{CG}$ during normal read operations and, in some embodiments, select desired columns 18-0 through 18-M to be written during write operations. The write and column select circuitry 32-0 through 32-$\text{NUM}_{CG}$ are controlled by a Y-decoder 36 and write enable generation circuitry 38, as discussed below in detail.

Figure 9:
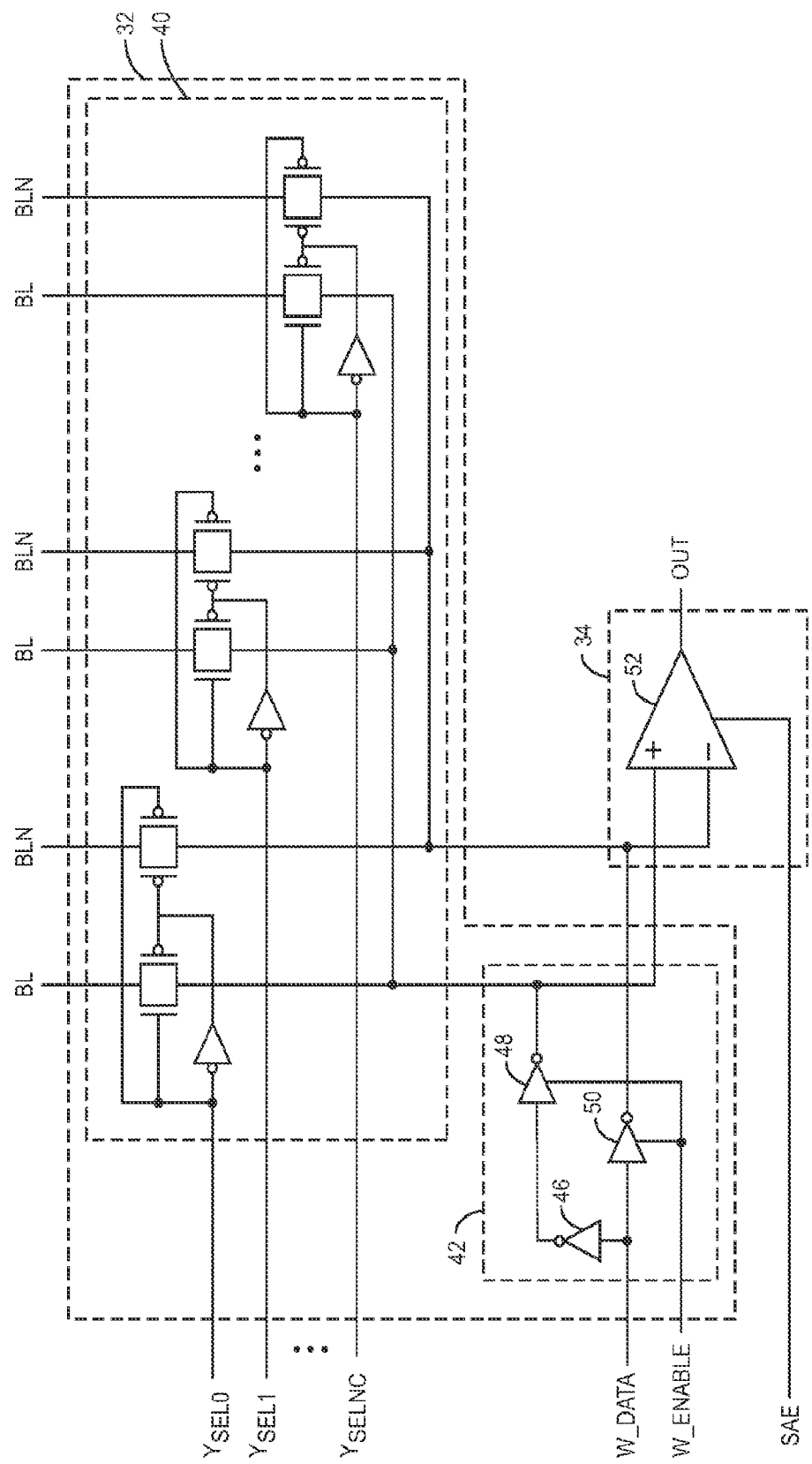
FIG. 9 illustrates the write and column select circuitry and the sense amplifier circuitry of FIG. 8 for one of the column groups in the SRAM bank in more detail according to one embodiment of the present disclosure.

FIG. 9 illustrates the write and column select circuitry 32 (generally referring to any one of the write and column select circuitries 32-0 through 32-NUM$_{CG}$ of FIG. 8) and the corresponding sense amplifier 34 (generally referring to the corresponding one of the sense amplifiers 34-0 through 34-NUM$_{CG}$ of FIG. 8). As illustrated, the write and column select circuitry 32 includes a Complementary Metal Oxide Semiconductor (CMOS) multiplexer 40 and write circuitry 42. The CMOS multiplexer 40 operates to connect the BL/BLN pairs for the columns in the corresponding column group to the write circuitry 42 and the sense amplifier 34 under control of a number of column select signals Y$_{SEL0}$ through Y$_{SELNC}$ provided by the Y-decoder 36 (FIG. 8). For example, when the column select signal Y$_{SEL0}$ is asserted, the BL/BLN pair for the column 18-0 is connected to the write circuitry 42 and the sense amplifier 34.

The write circuitry 42 includes NOT gates 46, 48, and one tri-state inverter (enabled NOT gate) 50 connected as shown. When enabled by a write enable control signal (W_ENABLE), the NOT gates 46, 48, and 50 operate to drive the BL(s) and BLN(s) connected via the CMOS multiplexer 40 to W_DATA and its complement, respectively, where W_DATA corresponds to a desired logic value to be written. Notably, particularly in normal operation, W_DATA may be different for each of the column groups 20-0 through 20-NUM$_{CG}$, as will be appreciated by one of ordinary skill in the art. In normal write mode, W_DATA is written to only one of the SRAM cells 14 whose word line (WL) is asserted and BL/BLN pair is connected to the write circuitry 42 via the CMOS multiplexer 40 by asserting one of the column select signals Y$_{SEL0}$ through Y$_{SELNC}$. In contrast, in parallel test mode, W_DATA is simultaneously written to multiple SRAM cells 14 whose word lines (WLs) are asserted and BL/BLN pairs are simultaneously connected to the write circuitry 42 via the CMOS multiplexer 40 by asserting multiple ones of the column select signals Y$_{SEL0}$ through Y$_{SELNC}$. Lastly, in this embodiment, the sense amplifier 34 includes an op-amp 52 having its inputs connected to the outputs of the CMOS multiplexer 40. Note, however, that for parallel testing, the sense amplifier 34 is not used. As such, for purposes of this disclosure, the sense amplifier 34 can be any desired sense amplifier that is suitable for a particular application.

Now, a number of exemplary parallel test processes for the SRAM bank 12 of FIGS. 8 and 9 will be described. Note that these parallel test processes are exemplary and are not intended to limit the scope of the present disclosure. These examples focus on testing a single block of SRAM cells 14 which may be the entire SRAM bank 12 but would normally be a subset of the SRAM cells 14 in the SRAM bank 12. However, it should be appreciated that these tests can be extended or repeated to test any remaining blocks in the SRAM bank 12.

First, a desired precondition logic value is written to the SRAM cells 14 in the block using a single parallel write operation. More specifically, in this example, during a low clock phase, PRECHN is asserted low, thereby precharging all of the BLs and BLNs to V$_{PRECH}$. Notably, in some embodiments, V$_{PRECH}$ is variable. In this case, for preconditioning, V$_{PRECH}$ is set to the same V$_{PRECH}$ used for normal operation, which is typically V$_{DD}$ or a voltage slightly less (e.g., about 200 to 300 mV less) than V$_{DD}$. Then, in the high clock phase, PRECHN is de-asserted high. In addition, all of the word lines (WLs) for the block are asserted by the X-decoder and driver circuitry 30, and all of the column select signals (Y$_{SEL0}$ through Y$_{SELNC}$) are asserted by the Y-decoder 36. In addition, W_ENABLE is asserted such that the desired precondition logic value represented by W_DATA is simultaneously written to all of the SRAM cells 14 in the block.

Next, a stress is applied to the block using a single parallel stress operation. In one embodiment, the stress is applied to test write margin. In one particular embodiment, the stress operation to test write margin is attempting to write the SRAM cells 14 in the block with the complement of the desired precondition logic value using a word line voltage (V$_{WL}$) that is decreased below V$_{DDARRAY}$ (e.g., V$_{WL}$=V$_{DDARRAY}$−100 mV). Normally, V$_{WL}$=V$_{DD}$, and V$_{DD}$ is either equal to or slightly greater than V$_{DDARRAY}$. In one embodiment, V$_{WL}$ is reduced by the X-decoder and driver circuitry 30. The amount by which V$_{WL}$ is reduced (referred to herein as write margin voltage or more generally as guard band voltage) is predetermined and can be selected to test for either SRAM cells 14 that are too weak (i.e., to easily written) or too strong (i.e., too difficult to write). In order to apply the stress to test write margin, in the low clock phase, the BLs and BLNs are precharged as discussed above. Then, during the high clock phase, PRECHN is de-asserted high. In addition, all of the word lines (WLs) for the test block are asserted to V$_{WL}$<V$_{DDARRAY}$ by the X-decoder and driver circuitry 30 and all of the column select signals (Y$_{SEL0}$ through Y$_{SELNC}$) are asserted by the Y-decoder 36. In addition, W_ENABLE is asserted such that an attempt is made to simultaneously write the complement of the desired precondition logic value to the SRAM cells 14 in the test block. The reduced V$_{WL}$ makes the access transistors M5 and M6 weaker and thus less capable of forcing a logic "0" against the PMOS pull-up transistors M2 and M4. Consequently, the write margin of the SRAM cells 14 in the test block is reduced in proportion to the gate overdrive reduction in the access transistors M5 and M6. When testing for SRAM cells 14 that are too weak, with the reduced V$_{WL}$, the SRAM cells 14 should not be written. When testing for SRAM cells 14 that are too strong, with the reduced V$_{WL}$, the SRAM cells 14 should be written. In a similar manner, the stress applied to the SRAM cells 14 in the test block to test for write margin may be attempting to write the SRAM cells 14 with the complement of the desired precondition logic value using V$_{DDARRAY}$>V$_{WL}$ (e.g., V$_{DDARRAY}$=V$_{wL}$ +100 mV), where in this case V$_{wL}$=V$_{DD}$, or alternatively using V$_{BL}$>V$_{SS}$.

In another embodiment, a stress is applied to test read SNM. In one particular embodiment, the stress applied to test read SNM is performing a read operation on the SRAM cells 14 in the block using V$_{PRECH}$=V$_{DD}$+guard band voltage. This increases voltage at the output node C or CN storing a logic "0," which reduces read SNM. More specifically, in the low clock phase, PRECHN is asserted low while V$_{PRECH}$ is raised above V$_{DD}$ (e.g., V$_{DD}$+400 mV). Then, in the high clock phase, PRECHN is de-asserted low while all of the word lines (WLs) of the SRAM cells 14 in the block are simultaneously asserted. Any SRAM cells 14 that have insufficient read SNM will flip. In another embodiment, the stress applied to test read SNM is performing a read operation using normal V$_{PRECH}$ (e.g., V$_{PRECH}$=V$_{DD}$) but with V$_{WL}$ increased by a desired guard band voltage (e.g., V$_{WL}$=V$_{DD}$+200 mV). An increased V$_{WL}$ increases the drive strength of the access transistors M5 and M6 of the SRAM cells 14 relative to that of the pull-down transistors M1 and M3, thereby making the SRAM cells 14 less stable. It does this by increasing the voltage at output node C or CN that stores logic "0" after the precondition write operation, thereby reducing the read SNM. In yet another embodiment, the stress applied to test read SNM is performing a read operation using V$_{DDARRAY}$<V$_{DD}$=V$_{WL}$=V$_{BL}$.

After stressing the SRAM cells 14 in the block, the parallel test read operation is performed. Specifically, the BLs and BLNs are precharged in the low clock phase. Then, in the high clock phase, PRECHN is de-asserted high, and all of the word lines (WLs) of the SRAM cells 14 in the block are simultaneously asserted. Any column having both a BL and a BLN read at a logic "0" include at least one failed SRAM cell 14. The entire process may be repeated for the opposite precondition logic value.

Figure 10:
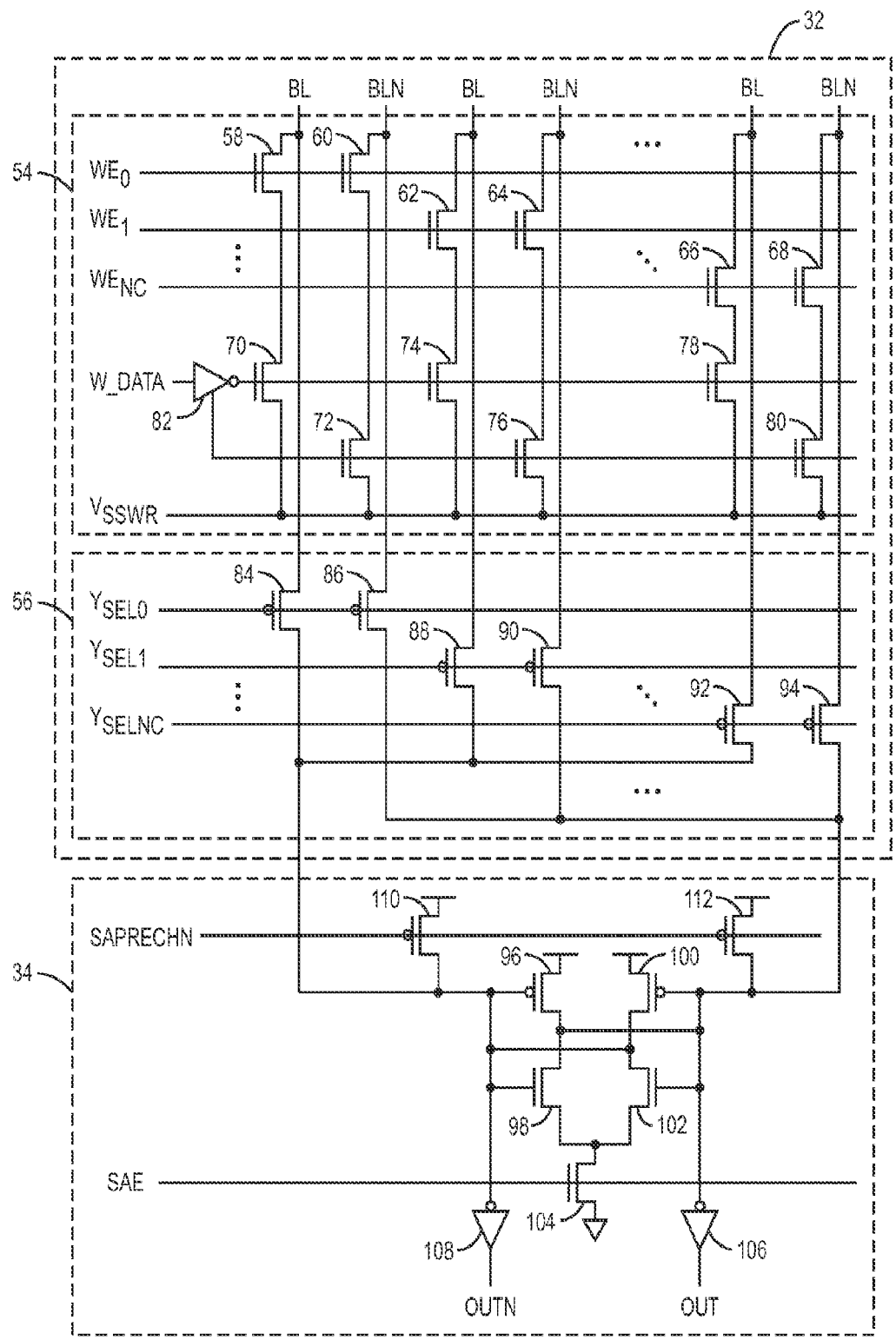
FIG. 10 illustrates the write and column select circuitry and the sense amplifier circuitry of FIG. 8 for one of the column groups in the SRAM bank in more detail according to another embodiment of the present disclosure.

FIG. 10 illustrates another embodiment of the write and column select circuitry 32 (generally referring to any one of the write and column select circuitry 32-0 through 32-NUM$_{CG}$ of FIG. 8) and the corresponding sense amplifier 34 (generally referring to the corresponding one of the sense amplifiers 34-0 through 34-NUM$_{CG}$ of FIG. 8). As illustrated, the write and column select circuitry 32 includes write circuitry 54 and a PMOS multiplexer 56. The write circuitry 54 includes a number of NMOS transistors 58 through 80 and a NOT gate 82 connected as shown. The NMOS transistors 58 through 68 are controlled by corresponding write enable signals (WE$_0$ through WE$_{NC}$), which are provided by the write enable generation circuitry 38 (FIG. 8) and each correspond to a different column of the SRAM cells 14 in the corresponding column group. In general, the NMOS transistors 58 and 70 operate to connect the corresponding BL to a low reference write voltage (V$_{SSWR}$) when the write enable signal WE$_0$ is asserted high and data to be written (W_DATA) corresponds to a logic "0." In other words, when a logic "0" is to be written to one of the SRAM cells 14 in the column 18-0, then WE$_0$ is asserted such that the BL for the column 18-0 is pulled to V$_{SSWR}$. Notably, V$_{SSWR}$ may be static (e.g., V$_{SS}$) or variable (e.g., V$_{SS}$ or V$_{SS}$ plus a predefined guard band). Similarly, the NMOS transistors 60 and 72 operate to connect the corresponding BLN to V$_{SSWR}$ when WE$_0$ is asserted and W_DATA corresponds to a logic "1." In other words, when a logic "1" is to be written to one of the SRAM cells 14 in the column 18-0, then WE$_0$ is asserted such that the BLN for the column 18-0 is pulled to V$_{SSWR}$. The remaining NMOS transistors 62 through 68 and 74 through 80 operate in a similar manner to enabling writing to the SRAM cells 14 in the corresponding columns.

The PMOS multiplexer 56, which may also be referred to herein as a Y-multiplexer, includes a number of PMOS transistors 84-94 connected as shown. The PMOS transistors 84-94 are controlled by the column select signals Y$_{SEL0}$ through Y$_{SELNC}$, which are provided by the Y-decoder 36 (FIG. 8) and each of which corresponds to a different column in the column group. The PMOS transistors 84 and 86 operate to connect the corresponding BL/BLN pair to the sense amplifier 34 when Y$_{SEL0}$ is asserted low. Likewise, the PMOS transistors 88 and 90 operate to connect the corresponding BL/BLN pair to the sense amplifier 34 when Y$_{SEL1}$ is asserted low, and the PMOS transistors 92 and 94 operate to connect the corresponding BL/BLN pair to the sense amplifier 34 when Y$_{SELNC}$ is asserted low.

In this embodiment, the sense amplifier 34 is a conventional CMOS sense amplifier formed by transistors 96 through 104 connected as shown, which is commonly referred to as a regenerative sense amplifier. Note, however, that since the sense amplifier 34 is not used for parallel testing, any desired type of sense amplifier 34 may be used. The outputs of the CMOS sense amplifier are inverted by corresponding inverters 106 and 108 to provide an output signal OUT and its complement OUTN, respectively. Notably, inputs of the CMOS sense amplifier are precharged to a desired precharge voltage (e.g., V$_{DD}$) prior to a sense operation. Precharging of the inputs of the CMOS sense amplifier is performed by pulling the inputs of the CMOS sense amplifier to the desired precharge voltage through PMOS transistors 110 and 112 by asserting a sense amplifier precharge control signal (SAPRECH).

Figure 11:
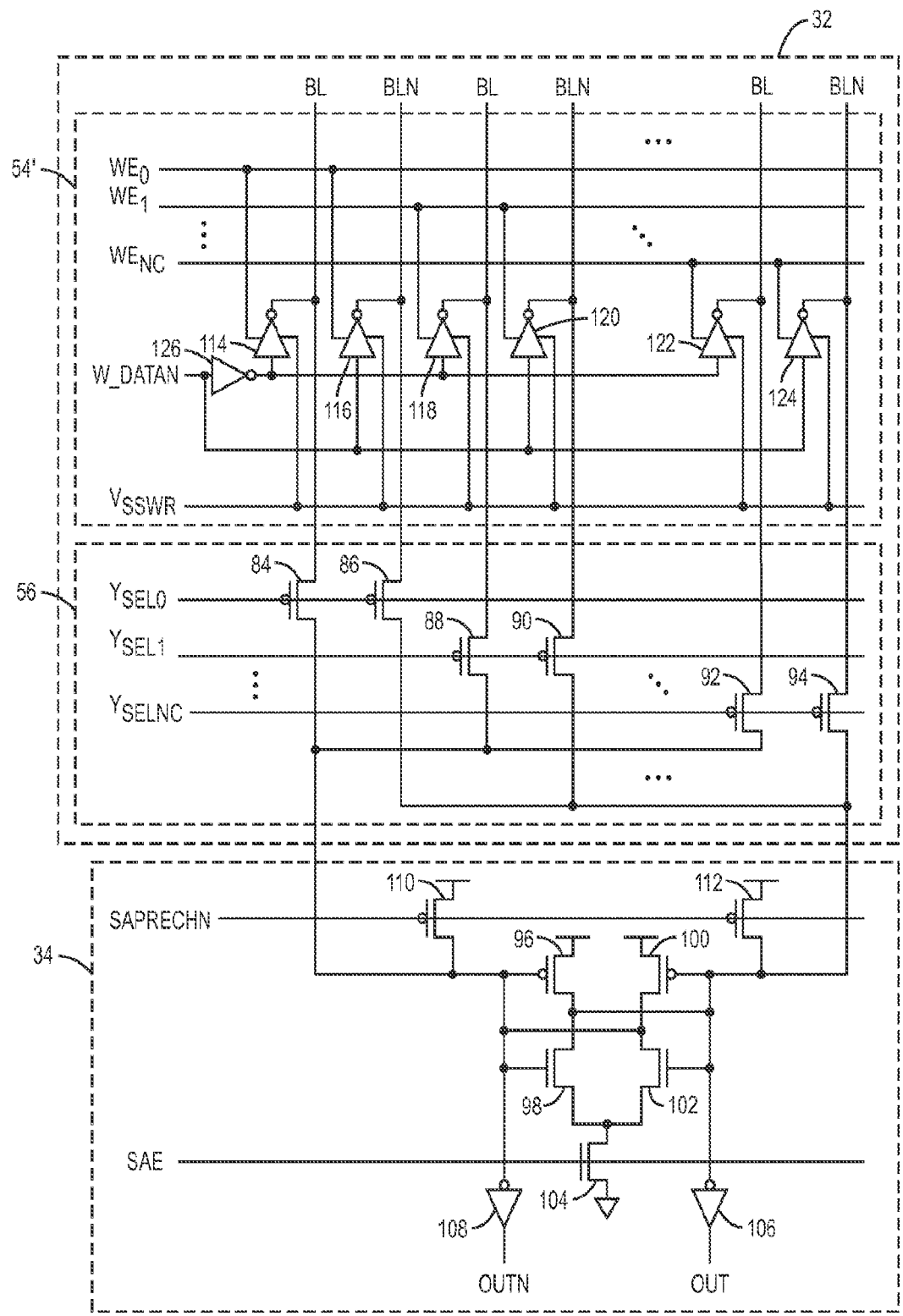
FIG. 11 illustrates the write and column select circuitry and the sense amplifier circuitry of FIG. 8 for one of the column groups in the SRAM bank in more detail according to yet another embodiment of the present disclosure.

FIG. 11 illustrates another embodiment of the write and column select circuitry 32 (generally referring to any one of the write and column select circuitry 32-0 through 32-NUM$_{CG}$ of FIG. 8) and the corresponding sense amplifier 34 (generally referring to the corresponding one of the sense amplifiers 34-0 through 34-NUM$_{CG}$ of FIG. 8). This embodiment is similar to that of FIG. 10. However, in this embodiment, the write circuitry 54 includes tri-state drivers 114 through 124 and a NOT gate 126 connected as shown. In general, the tri-state drivers 114 through 124 operate to drive the corresponding BL or BLN to V$_{DD}$ (or a high write reference voltage (V$_{DDWR}$)) or V$_{SSWR}$ depending on W_DATAN (complement of W_DATA) and the corresponding write enable signals WE$_0$ through WE$_{NC}$. Thus, as an example, if W_DATAN is logic "0" and WE$_0$ is asserted high, then the tri-state driver 114 drives the corresponding BL to V$_{DD}$ (or V$_{DDWR}$), and the tri-state driver 116 drives the corresponding BLN to V$_{SSWR}$. The remaining tri-state drivers 118 through 124 operate in the same manner.

Figure 12:
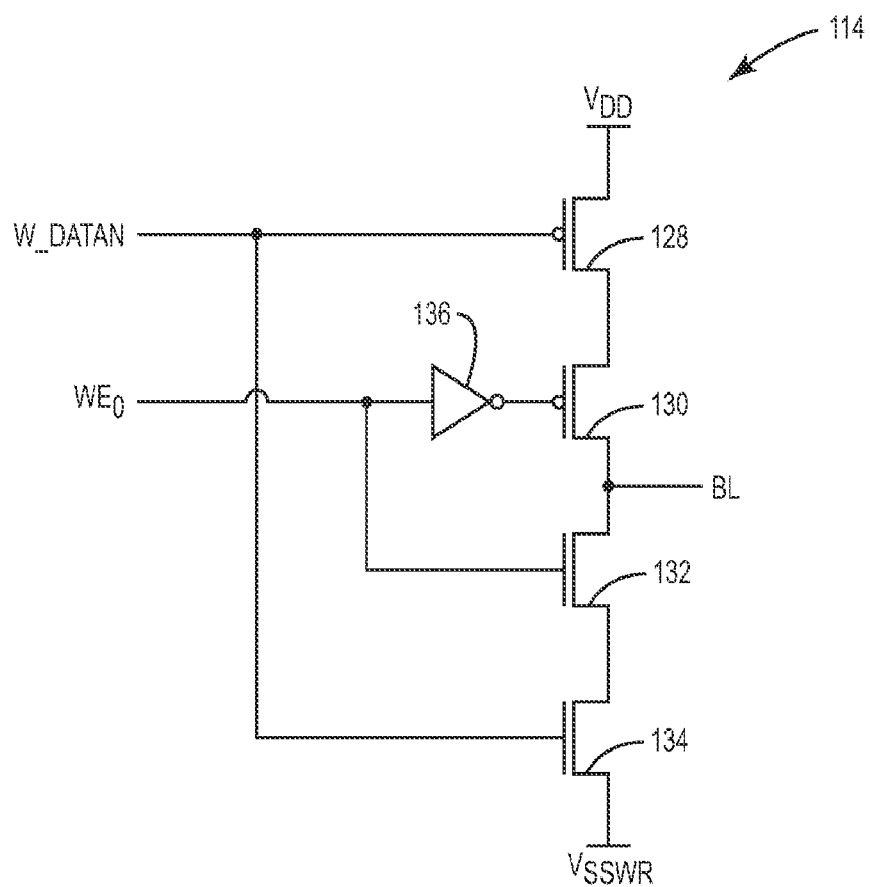
FIG. 12 illustrates one of the tri-state drivers of FIG. 11 in more detail according to one embodiment of the present disclosure.

FIG. 12 is a schematic diagram of the tri-state driver (enabled NOT gate) 114 of FIG. 11 according to one embodiment of the present disclosure.

This discussion is equally applicable to the other tri-state drivers 116 through 124. As illustrated, the tri-state driver 114 includes PMOS transistors 128 and 130, NMOS transistors 132 and 134, and a NOT gate 136 connected as shown. In general, the tri-state driver 114 pulls the bit line (BL) to V$_{DD}$ (or V$_{DDWR}$) when W_DATAN (i.e., the complement of W_DATA output by the NOT gate 126 of FIG. 11) is logic "0" and WE$_0$ is asserted high (i.e., logic "1"). Conversely, the tri-state driver 114 pulls the bit line (BL) to V$_{SSWR}$ when W_DATAN is logic "1" and WE$_0$ is asserted.

Now, a number of exemplary parallel test processes for the SRAM bank 12 of FIGS. 8 and 10 and FIGS. 8 and 11 will be described. Note that these parallel test processes are exemplary and are not intended to limit the scope of the present disclosure. These examples focus on testing a single block of the SRAM cells 14 which may be the entire SRAM bank 12 but would normally be a subset of the SRAM cells 14 in the SRAM bank 12. However, it should be appreciated that these tests can be extended or repeated to test any remaining blocks in the SRAM bank 12.

First, a desired precondition logic value is written to the SRAM cells 14 in the block using a single parallel write operation. More specifically, in this example, during a low clock phase, PRECHN is asserted low, thereby precharging all of the BLs and BLNs to V$_{PRECH}$. Notably, in some embodiments, V$_{PRECH}$ is variable. In this case, for preconditioning, V$_{PRECH}$ is set to the same V$_{PRECH}$ used for normal operation, which is typically V$_{DD}$ or a voltage slightly less (e.g., about 200 to 300 mV less) than V$_{DD}$. Then, in the high clock phase, PRECHN is de-asserted high. In addition, all of the word lines (WLs) for the block are asserted by the X-decoder and driver circuitry 30 while simultaneously asserting all of the write enable signals (WE$_0$ through WE$_{NC}$) such that the desired precondition logic value represented by W_DATA is simultaneously written to all of the SRAM cells 14 in the block. Notably, during the test write, all of the column select signals (Y$_{SEL0}$ to Y$_{SELNC}$) may be, but are not necessarily, de-asserted by the Y-decoder 36.

Next, a stress is applied to the block using a single parallel stress operation. In one embodiment, the stress is applied to test write margin. In one particular embodiment, the stress operation to test write margin is attempting to write the SRAM cells 14 in the block with the complement of the desired precondition logic value using an increased $V_{SSWR}$. Specifically, in this case, $V_{SSWR}=V_{SS}$+guard band voltage, where $V_{SS}$ is referred to as a baseline low reference voltage for the SRAM bank 12 (e.g., ground). Normally, $V_{SSWR}=V_{SS}$.

The amount by which $V_{SSWR}$ is increased (referred to herein as write margin voltage or more generally as guard band voltage) is predetermined and can be selected to test for either SRAM cells 14 that are too weak (i.e., to easily written) or too strong (i.e., too difficult to write). In order to apply the stress to test write margin, in the low clock phase, the BLs and BLNs are precharged as discussed above. Then, during the high clock phase, PRECHN is de-asserted high. In addition, all of the word lines (WLs) for the test block are asserted by the X-decoder and driver circuitry 30 and all of the write enable signals ($WE_0$ through $WE_{NC}$) are asserted by the write enable generation circuitry 38 such that an attempt is made to simultaneously write the complement of the desired precondition logic value to the SRAM cells 14 in the test block. The write margin of the SRAM cells 14 is reduced in proportion to the higher $V_{SSWR}$ (which is also referred to herein as the bit line voltage ($V_{BL}$)). When testing for SRAM cells 14 that are too weak, with the increased $V_{SSWR}$, the SRAM cells 14 should not be written. When testing for SRAM cells 14 that are too strong, with the increased $V_{SSWR}$, the SRAM cells 14 should be written. In a similar manner, the stress applied to the SRAM cells 14 in the block to test for write margin may be attempting to write the SRAM cells 14 with the complement of the desired precondition logic value using $V_{WL}<V_{DDARRAY}$ or alternatively $V_{DDARRAY}>V_{WL}$.

In another embodiment, a stress is applied to test read SNM. In one particular embodiment, the stress applied to test read SNM is performing a read operation on the SRAM cells 14 in the block using $V_{PRECH}=V_{DD}$+guard band voltage. This increases voltage at the output node C or CN storing a logic "0," which reduces read SNM. More specifically, in the low clock phase, PRECHN is asserted low while $V_{PRECH}$ is raised above $V_{DD}$ (e.g., $V_{DD}$+400 mV). Then, in the high clock phase, PRECHN is de-asserted low while all of the word lines (WLs) of the SRAM cells 14 in the block are simultaneously asserted. Any SRAM cells 14 that have insufficient read SNM will flip. In another embodiment, the stress applied to test read SNM is performing a read operation using normal $V_{PRECH}$ (e.g., $V_{PRECH}=V_{DD}$) but with $V_{WL}$ increased above $V_{DD}$ by a desired guard band voltage (e.g., $V_{WL}=V_{DD}$+200 mV). An increased $V_{WL}$ increases the drive strength of the access transistors M5 and M6 of the SRAM cells 14 relative to that of the pull-down transistors M1 and M3, thereby making the SRAM cells 14 less stable. It does this by increasing the voltage at output node C or CN that stores logic "0" after the precondition write operation, thereby reducing the read SNM. In yet another embodiment, the stress applied to test read SNM is performing a read operation using $V_{DDARRAY}<V_{DD}=V_{WL}=V_{BL}$.

After stressing the SRAM cells 14 in the block, the parallel test read operation is performed. Specifically, the BLs and BLNs are precharged in the low clock phase. Then, in the high clock phase, PRECHN is de-asserted high, and all of the word lines (WLs) of the SRAM cells 14 in the block are simultaneously asserted. Any column having both a BL and a BLN read at a logic "0" include at least one failed SRAM cell 14. The entire process may then be repeated for the opposite precondition logic value.

Figure 13:
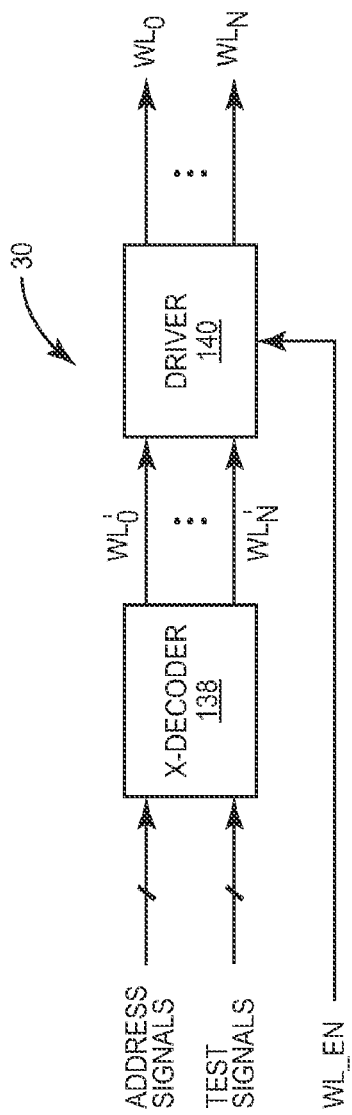
FIG. 13 illustrates the X-decoder and driver circuitry of FIG. 8 in more detail according to one embodiment of the present disclosure.

FIG. 13 is a block diagram of the X-decoder and driver circuitry 30 of FIG. 8 according to one embodiment of the present disclosure. As illustrated, the X-decoder and driver circuitry 30 includes an X-decoder 138 and a driver 140. In this embodiment, the X-decoder 138 is configurable in either a normal word line (WL) enable mode where only one word line (WL) is asserted at a time or one of a number of parallel test modes where multiple word lines (WLs) are asserted simultaneously for parallel testing. The X-decoder 138 receives a number of address signals ($A_{x0} \ldots A_{xn}$), where $2^n$ is equal to the number of rows 16-0 through 16-N of SRAM cells 14 in the SRAM bank 12, and a number of test signals that control a mode of operation of the X-decoder 138. In the normal mode of operation, the X-decoder 138 asserts one of its output signals ($WL_0'$ through $WL_N'$) that corresponds to the address provided by the address signals ($A_{x0} \ldots A_{xn}$). In the test mode of operation, the X-decoder 138 simultaneously asserts more than one of the output signals ($WL_0'$ through $WL_N'$). For example, the X-decoder 138 may be configurable to simultaneously assert 2, 4, 8, or 16 of the output signals ($WL_0'$ through $WL_N'$) when operating in test mode.

Figure 14:
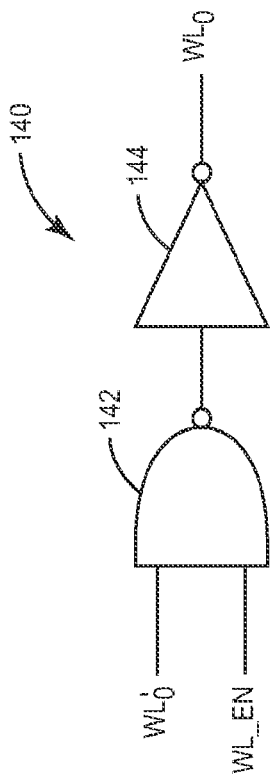
FIG. 14 illustrates a component of the driver circuitry of FIG. 13 for a single word line according to one embodiment of the present disclosure.

The output signals ($WL_0'$ through $WL_N'$) of the X-decoder 138 are input to the driver 140, which in turn outputs corresponding word line signals ($WL_0$ to $WL_N$). FIG. 14 illustrates a portion of the driver 140 for $WL_0$ according to one embodiment of the present disclosure. Notably, the driver 140 includes similar circuits for the rest of the word lines ($WL_1$ through $WL_N$) as well. As illustrated, the portion of the driver 140 includes a NAND gate 142 and a NOT gate 144 connected as shown. In operation, $WL_0$ is asserted high when both $WL_0'$ and WL_EN are asserted high. WL_EN is a control signal that is asserted by, for example, timing and control circuitry (not shown) during read or write operations as well as during some parallel test operations that utilize write operations.

Figure 15:
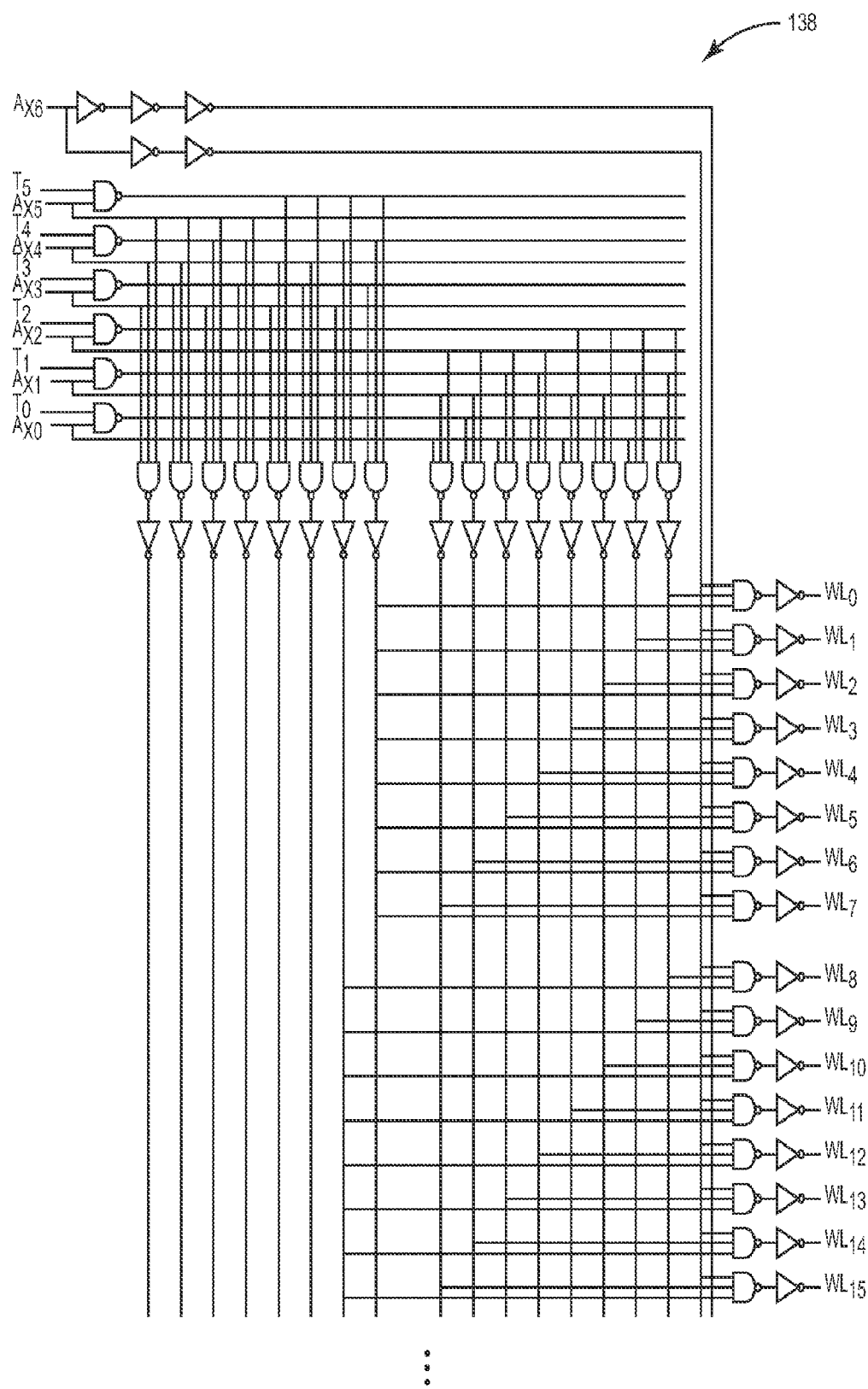
FIG. 15 illustrates an exemplary embodiment of the X-decoder of FIG. 13 according to one embodiment of the present disclosure.

FIG. 15 illustrates one exemplary embodiment of the X-decoder 138 of FIG. 13. In this exemplary embodiment, there are 128 word lines (i.e., $WL_0$ through $WL_{127}$), and the X-decoder 138 is configured by test signals $T_0$ through $T_5$ to operate in one of the following modes:

Normal Mode (1 WL asserted): The X-decoder 138 is configured in normal mode by asserting $T_0$ through $T_5$ high. The address signals $A_{X0}$ through $A_{X6}$ determine which WL is asserted (enabled).

2 WL Test Mode (2 WLs asserted): The X-decoder 138 is configured in 2 WL test mode by asserting $T_0$ low and asserting $T_1$ through $T_5$ high. In 2 WL test mode, $A_{X0}$ is asserted high, and $A_{X1}$ through $A_{X6}$ determine which two WLs are asserted (enabled).

4 WL Test Mode (4 WLs asserted): The X-decoder 138 is configured in 4 WL test mode by asserting $T_0$ and $T_1$ low and asserting $T_2$ through $T_5$ high. In 4 WL test mode, $A_{X0}$ and $A_{X1}$ are asserted high, and $A_{X2}$ through $A_{X6}$ determine which four WLs are asserted (enabled).

8 WL Test Mode (8 WLs asserted): The X-decoder 138 is configured in 8 WL test mode by asserting $T_0$ through $T_2$ low and asserting $T_3$ through $T_5$ high. In 8 WL test mode, $A_{X0}$ through $A_{X2}$ are asserted high, and $A_{X3}$ through $A_{X6}$ determine which eight WLs are asserted (enabled).

16 WL Test Mode (16 WLs asserted): The X-decoder 138 is configured in 16 WL test mode by asserting $T_0$ through $T_3$ low and asserting $T_4$ through $T_5$ high. In 16 WL test mode, $A_{X0}$ through $A_{X3}$ are asserted high, and $A_{X4}$ through $A_{X6}$ determine which sixteen WLs are asserted (enabled).

Figure 16A:
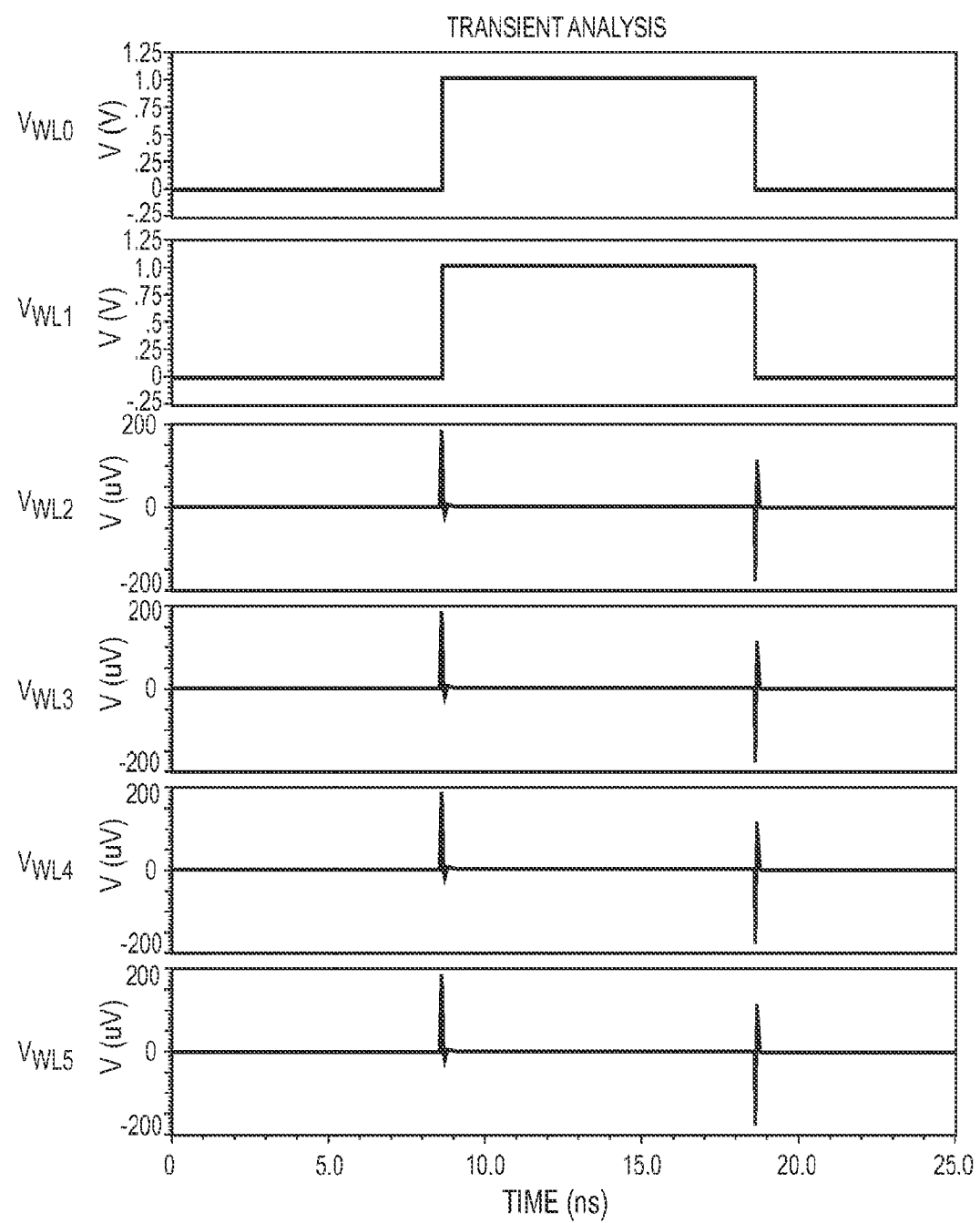
FIGS. 16A through 16D illustrate the output of the X-decoder of FIG. 15 for various modes according to one embodiment of the present disclosure.
Figure 16B:
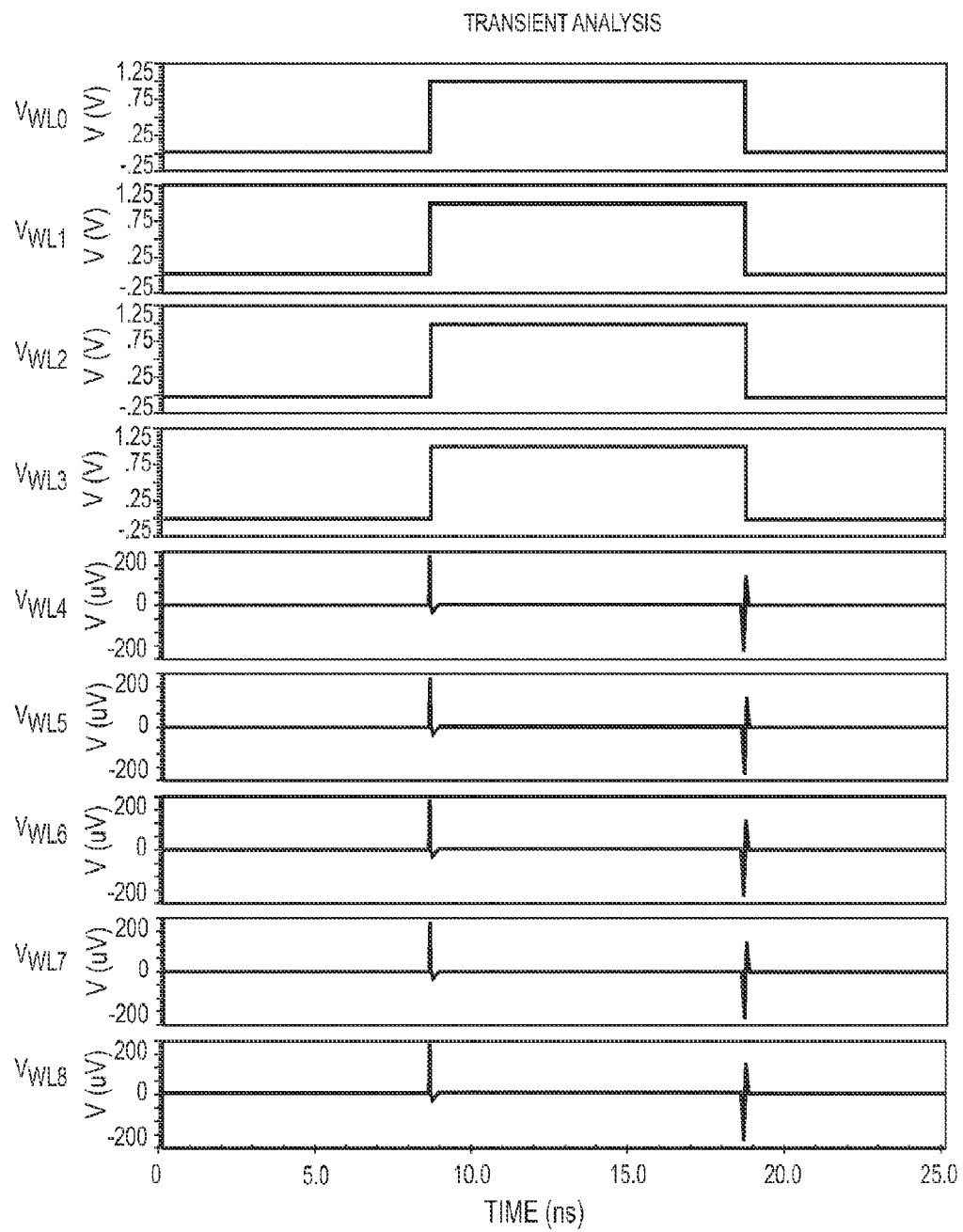
Figure 16C:
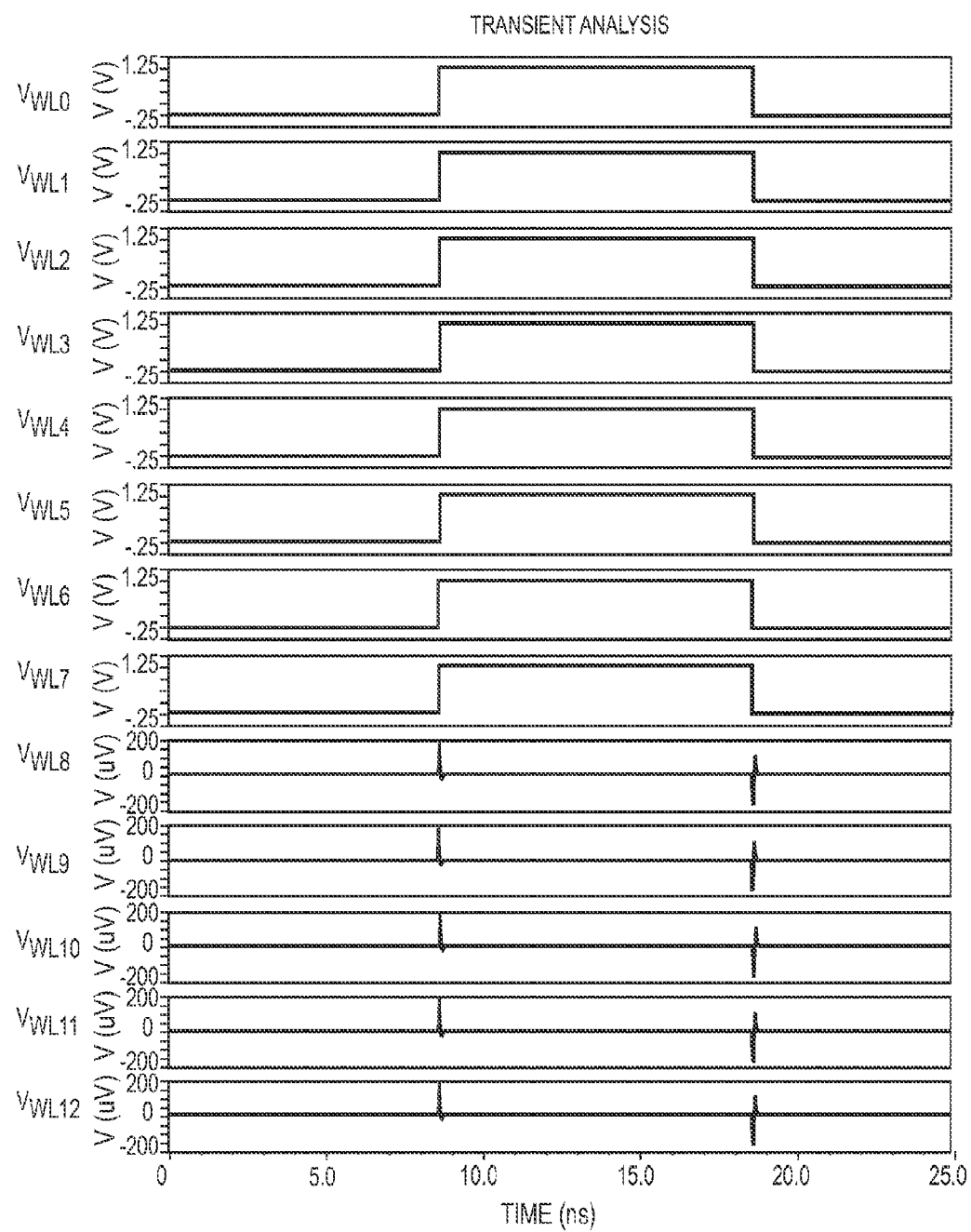
Figure 16D:
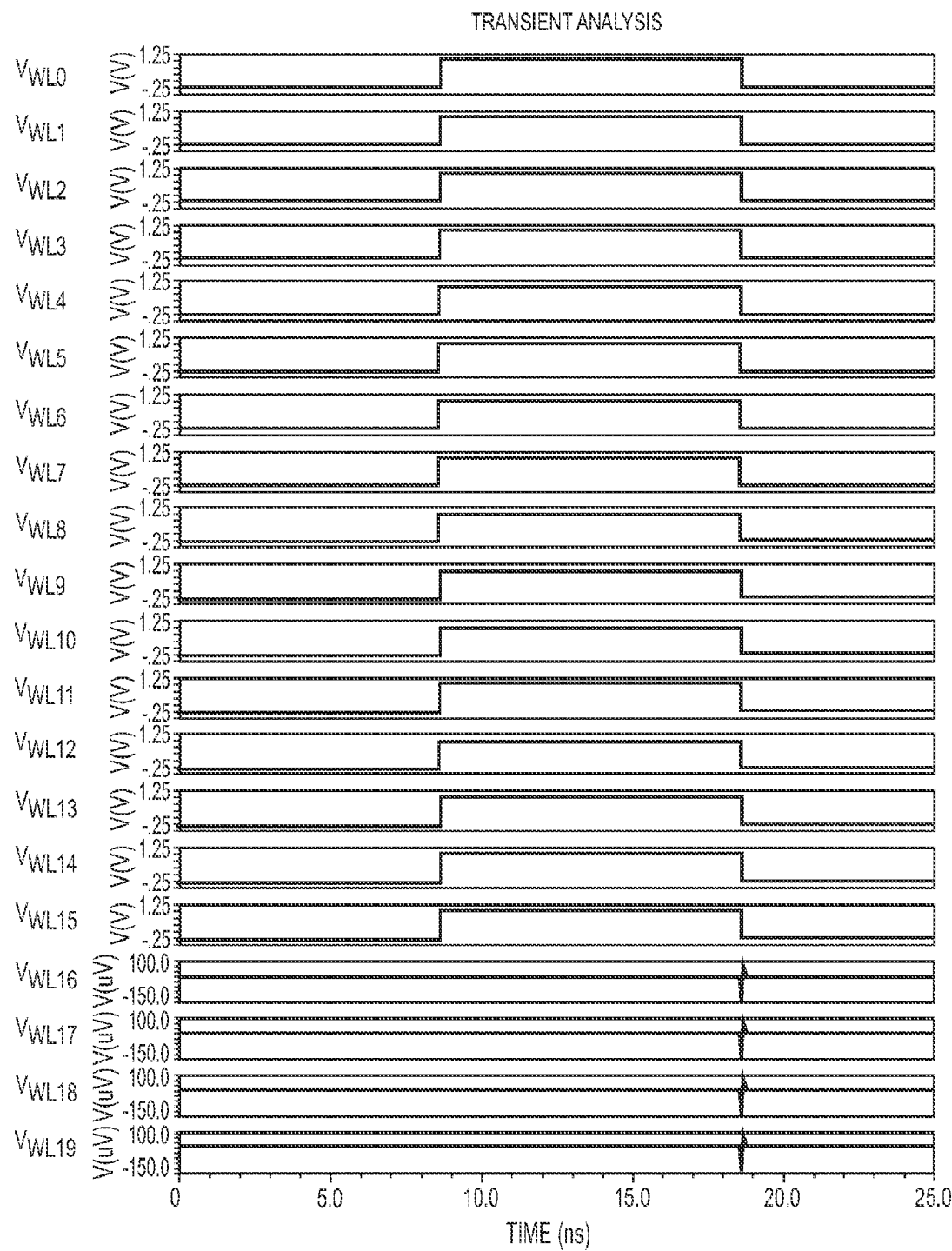

FIGS. 16A through 16D illustrate the output of the X-decoder 138 of FIG. 15 for the 2 WL test mode, the 4 WL test mode, the 8 WL test mode, and the 16 WL test mode, respectively. As shown in FIG. 16A, in the 2 WL test mode, two WLs are asserted at one time. Likewise, in FIG. 16B, in the 4 WL test mode, four WLs are asserted at one time. In FIG. 16C, in the 8 WL test mode, eight WLs are asserted at one time. Lastly, in FIG. 16D, in the 16 WL test mode, sixteen WLs are asserted at one time.

Notably, while asserting all word lines (WLs) would be ideal, in most applications, this is impracticable due to lack of drive strength. As such, an X-decoder, such as the X-decoder 138 illustrated and described with respect to FIGS. 15 and 16A through 16D, is beneficial in that it enables assertion of subsets of the word lines (WLs). In addition, the configurable nature of the X-decoder 138 of FIG. 15 provides additional benefits such as, for example, allowing the number of word lines (WLs) asserted at a time for test operations to be configured to adjust readout speed (decreasing number of word lines (WLs) simultaneously asserted increases readout speed) and/or throughput (increasing number of word lines (WLs) simultaneously asserted increases throughput).

Figure 17:
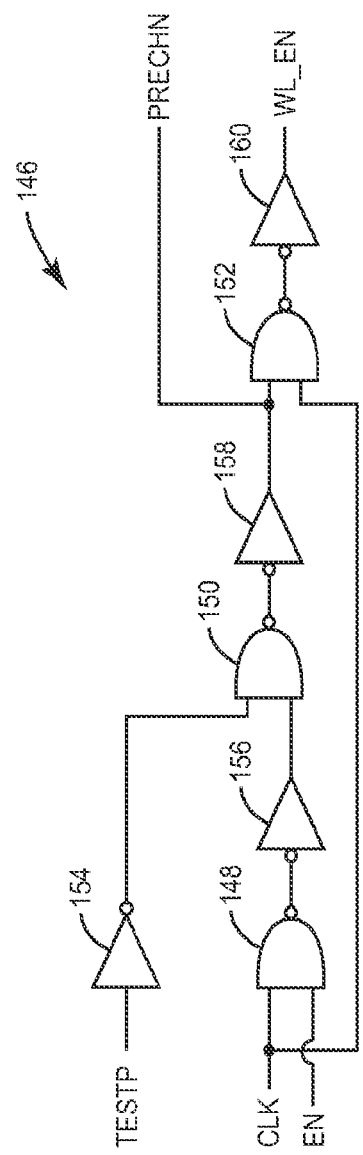
FIG. 17 illustrates PRECHN and WL_EN generation circuitry according to one embodiment of the present disclosure.

FIG. 17 illustrates an exemplary embodiment of PRECHN and WL_EN generation circuitry 146. As discussed above, PRECHN controls precharging of the BLs and BLNs of the SRAM cells 14, and WL_EN enables the X-decoder and driver circuitry 30. As illustrated, the PRECHN and WL_EN generation circuitry 146 includes NAND gates 148, 150, and 152 and NOT gates 154, 156, 158, and 160 connected as shown. The PRECHN and WL_EN generation circuitry 146 is controlled by a test control signal (TESTP) that is high when precharging of the BLs and BLNs is desired in test mode and otherwise low, a clock signal (CLK), and an enable signal (EN). In general, when precharging of the BLs and BLNs is desired in test mode, TESTP is asserted high. As a result, PRECHN is forced low regardless of the state of CLK and EN. Notably, both PRECHN and WL_EN can be asserted at the same time, which allows stress to be applied to the SRAM cells 14 for parallel testing of, for example, read SNM (e.g., asserting PRECHN low with $V_{PRECH} > V_{DD}$ while simultaneously asserting WLs for the block of SRAM cells 14 being tested will apply stress for testing read SNM).

Figure 18:
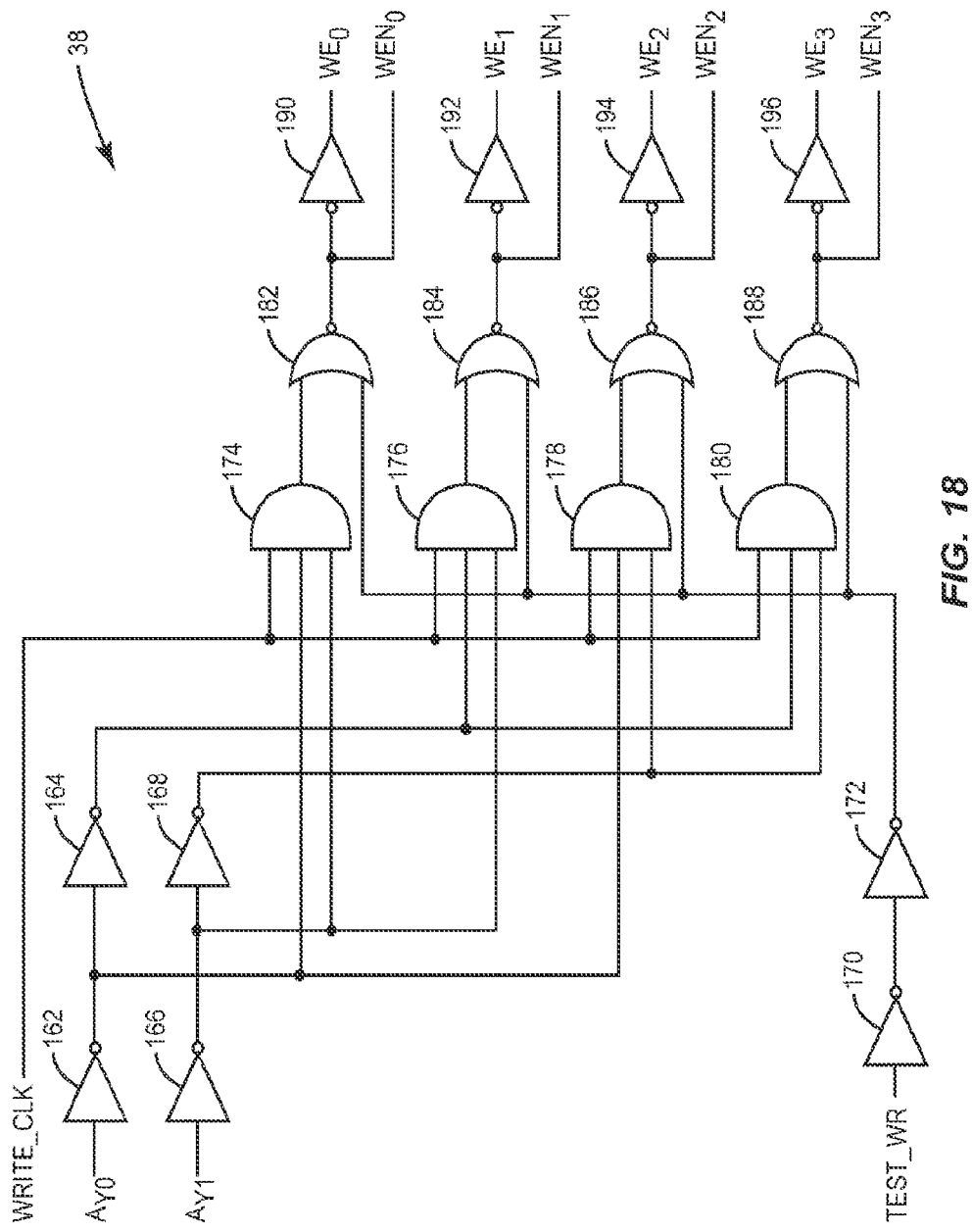
FIG. 18 illustrates an exemplary embodiment of the write enable (WE) generation circuitry of FIG. 8 according to one embodiment of the present disclosure.

FIG. 18 illustrates an exemplary embodiment of the write enable generation circuitry 38 of FIG. 8. In general, the write enable generation circuitry 38 operates to decode a column address signal to assert one of the write enable signals ($WE_0$ through $WE_{NC}$) high when in normal operation. However, when in test mode, the write enable generation circuitry 38 asserts all of the write enable signals ($WE_0$ through $WE_{NC}$) high. More specifically, in this particular example, the write enable generation circuitry 38 is formed by NOT gates 162 through 172, AND gates 174 through 180, NOR gates 182 through 188, and NOT gates 190 through 196 connected as shown. In this example, for simplicity, there are four columns of SRAM cells 14 in each of the column groups 20-0 through 20-$NUM_{CG}$ in the SRAM bank 12. However, each of the column groups 20-0 through 20-$NUM_{CG}$ may have any number of two or more columns of SRAM cells 14. Since there are four columns of SRAM cells 14, there are four write enable signals ($WE_0$ through $WE_3$) that enable writing to corresponding columns. A two bit column address signal ($A_{Y0}$ and $A_{Y1}$) is used to address the write enable signals ($WE_0$ through $WE_3$). For example, in normal mode, when $A_{Y0}$ and $A_{Y1}$ are both low and TEST_WR is low, $WE_0$ is asserted high and the remaining write enable signals $WE_1$ through $WE_3$ are low. TEST_WR is a test write control signal. During parallel testing, if simultaneous writing of a test block of SRAM cells 14 is desired, TEST_WR is asserted, which in turn forces all of the write enable signals $WE_0$ through $WE_1$ high.

Figure 19:
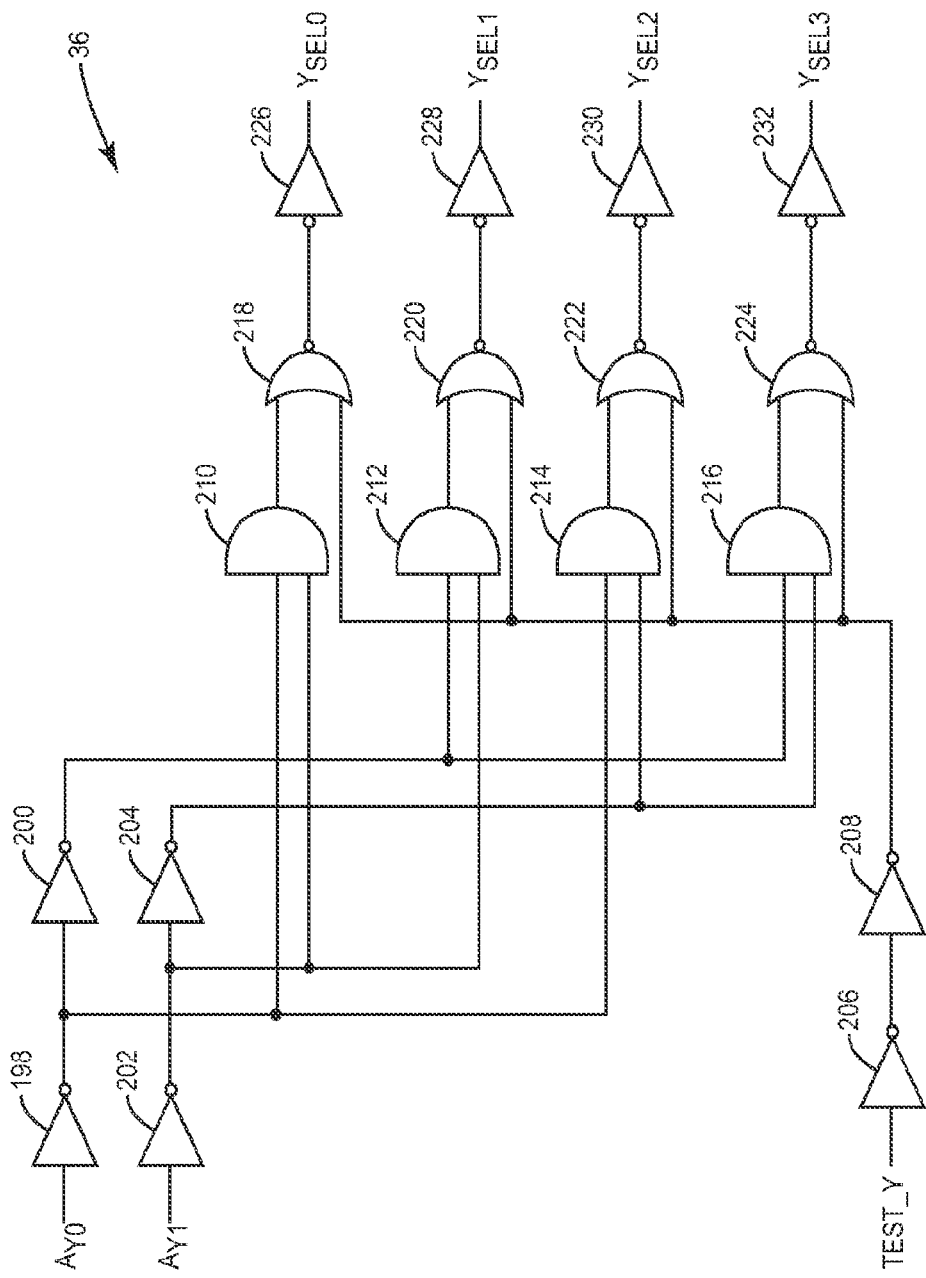
FIG. 19 illustrates an exemplary embodiment of the Y-decoder of FIG. 8 according to one embodiment of the present disclosure.

FIG. 19 illustrates an exemplary embodiment of the Y-decoder 36 of FIG. 8. In general, the Y-decoder 36 operates to decode a column address signal to assert one of the column select signals ($Y_{SEL0}$ through $Y_{SELNC}$) when in normal operation. However, when in test mode, the Y-decoder 36 asserts all of the column select signals ($Y_{SEL0}$ through $Y_{SELNC}$). More specifically, in this particular example, the Y-decoder 36 is formed by NOT gates 198 through 208, AND gates 210 through 216, NOR gates 218 through 224, and NOT gates 226 through 232 connected as shown. In this example, for simplicity, there are four columns of SRAM cells 14 in each of the column groups 20-0 through 20-$NUM_{CG}$ in the SRAM bank 12. However, each of the column groups 20-0 through 20-$NUM_{CG}$ may have any number of two or more columns of SRAM cells 14. Since there are four columns of SRAM cells 14, there are four column select signals ($Y_{SEL0}$ through $Y_{SELNC}$). A two bit column address signal ($A_{Y0}$ and $A_{Y1}$) is used to address the column select signals ($Y_{SEL0}$ through $Y_{SELNC}$). For example, in normal mode, when $A_{Y0}$ and $A_{Y1}$ are both low and TEST_Y is low, $Y_{SEL0}$ is asserted high and the remaining column select signals $Y_{SEL1}$ to $Y_{SEL3}$ are de-asserted low. TEST_Y is a test column select control signal. During parallel testing, if simultaneous column selection is desired, TEST_Y is asserted, which in turn forces all of the column select signals ($Y_{SEL0}$ through $Y_{SELNC}$) to be asserted high. While these examples use four columns per column group, extension to other values of NC is straightforward.

Figure 20:
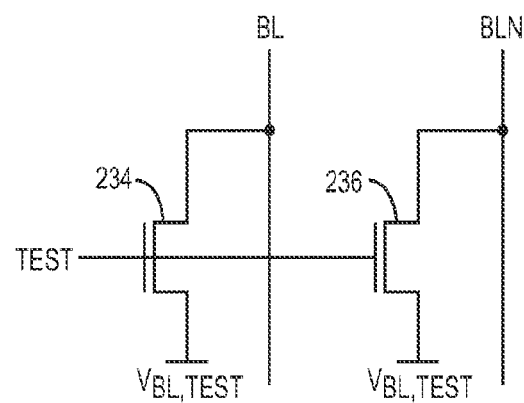
FIG. 20 illustrates circuitry that enables both the bit line (BL) and bit line not (BLN) of columns of SRAM cells to be driven to a common test voltage to enable one exemplary type of parallel testing of the SRAM cells according to one embodiment of the present disclosure.

FIG. 20 illustrates another embodiment of circuitry that can be utilized to stress the SRAM cells 14 in a parallel stress operation. As illustrated, transistors 234 and 236 can be utilized to pull both BL and BLN for a column of SRAM cells 14 to a test bit line voltage ($V_{BL,\,TEST}$), which may be $V_{SS}$ (e.g., ground) or a predetermined voltage above $V_{SS}$ that provides a desired amount of stress on the SRAM cells 14. In operation, a control signal (TEST) is asserted to turn on the transistors 234 and 236 while the word lines (WLs) for the test block of SRAM cells 14 to be stressed are asserted. Similar circuits can be used to stress the BLs and BLNs of the remaining columns of SRAM cells 14.

Figure 21:
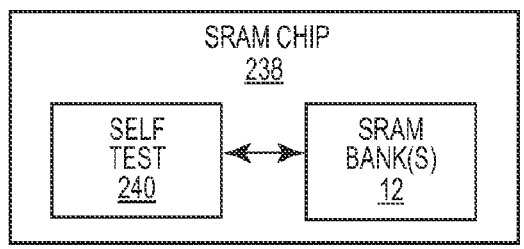
FIG. 21 illustrates an SRAM chip, or integrated circuit, including self-test circuitry according to one embodiment of the present disclosure.

FIG. 21 illustrates an integrated circuit, which is referred to as an SRAM chip 238, that includes a number of SRAM banks 12 and self-test circuitry 240. The SRAM chip 238 may be, for example, a memory chip, an integrated circuit comprising SRAM (e.g., SRAM cache), or the like. The self-test circuitry 240 may be implemented entirely in hardware or may be implemented as a combination of hardware and software. In operation, the self-test circuitry 240 controls parallel testing of the SRAM banks 12 in the manner described above. Specifically, the self-test circuitry 240 provides timing, control, and/or address signals as needed for the parallel test operations (e.g., row address signals, column address signals, Sense Amplifier Enable (SAE) signals, or the like). The self-test circuitry 240 may perform parallel testing at any desired time such as, for example, power-up of the SRAM chip 238.

Figure 22:
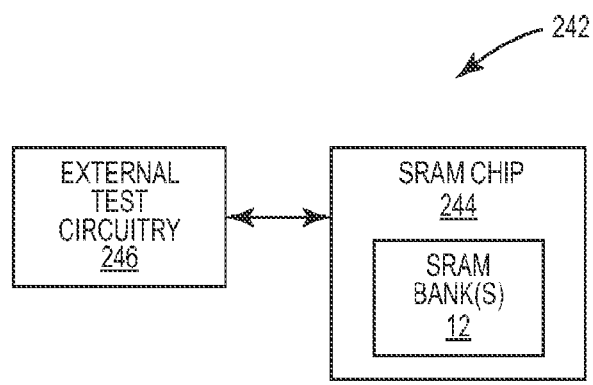
FIG. 22 illustrates an SRAM chip, or integrated circuit, that is tested by an external circuit according to another embodiment of the present disclosure.

FIG. 22 illustrates a system 242 that includes an integrated circuit, which is referred to as an SRAM chip 244, that includes a number of SRAM banks 12. In addition, the system 242 includes external test circuitry 246 that is connected to the SRAM chip 244. The external test circuitry 246 may be implemented entirely in hardware or as a combination of hardware and software. In operation, the external test circuitry 246 controls parallel testing of the SRAM banks 12 in the manner described above. Specifically, the external test circuitry 246 provides timing, control, and/or address signals as needed for the parallel test operations (e.g., row address signals, column address signals, SAE, or the like).

For stand-alone memories, access and testing of SRAM cell analog characteristics has heretofore not been directly possible. A large number of first order variables subtly affect the SRAM cells. Therefore, most memory test engineers characterize a given product line empirically against a broad range of memory patterns before settling on a test suite that allows high volume cost while catching the dominant failure modes. These characterization test suites (known as "kitchen sink" test suites) consist of both algorithmic patterns and different sets of cell stability tests (e.g., data retention, bump tests, etc.). Consequently, it is difficult to calculate with certainty the speedup afforded by the above described read and write margin tests. However, since the patterns require multiple passes of reads and writes and employ no parallelism, the test speedup using the circuits and methods described herein may easily be over 1000×.

Those skilled in the art will recognize improvements and modifications to the preferred embodiments of the present disclosure. All such improvements and modifications are considered within the scope of the concepts disclosed herein and the claims that follow.

What is claimed is:

1. A method of testing a plurality of Static Random Access Memory (SRAM) cells arranged into a plurality of rows and a plurality of columns where each column of the plurality of columns has a corresponding bit line (BL) and bit line not (BLN) and each row of the plurality of rows has a corresponding word line (WL), comprising:
performing one or more parallel test operations on the plurality of SRAM cells, wherein each parallel test operation of the one or more parallel test operations is a test operation performed on a block of the plurality of SRAM cells and where performing the one or more parallel test operations comprises:
for each parallel write operation of one or more parallel write operations where each parallel write operation of the one or more parallel write operations writes a desired precondition logic value to a different block of SRAM cells from the plurality of SRAM cells:
simultaneously driving at least one of the BL and BLN for each column in the block of SRAM cells for the parallel write operation to a voltage level that corresponds to the desired precondition logic value; and
simultaneously asserting the WL for each row in the block of SRAM cells for the parallel write operation while driving the at least one of the BL and BLN for each column in the block of SRAM cells for the parallel write operation to a voltage level that corresponds to the desired precondition logic value, the block of SRAM cells for the parallel write operation comprising two or more rows and two or more columns; and
reading the plurality of columns via one or more parallel read operations, where each parallel read operation of the one or more parallel read operations is for a different block of SRAM cells from the plurality of SRAM cells.

2. The method of claim 1 wherein for each parallel write operation of the one or more parallel write operations, the block of the plurality of SRAM cells for the parallel write operation includes SRAM cells from the plurality of SRAM cells in two or more of the plurality of rows.

3. The method of claim 1 wherein the plurality of columns are further arranged into one or more column groups, and, for each parallel test operation of the one or more parallel write operations, the block of the plurality of SRAM cells for the parallel write operation includes SRAM cells from the plurality of SRAM cells in two or more of the plurality of columns in a same one of the one or more column groups.

4. The method of claim 1 wherein the plurality of columns are further arranged into one or more column groups, and, for each parallel test-operation of the one or more parallel test operations, the block of the plurality of SRAM cells for the parallel test-operation includes SRAM cells from the plurality of SRAM cells in two or more of the plurality of rows and SRAM cells from the plurality of SRAM cells in two or more of the plurality of columns in a same one of the one or more column groups.

5. The method of claim 1 wherein reading the plurality of columns via the one or more parallel read operations comprises, for each parallel read operation of the one or more parallel read operations:
precharging the BL and BLN for each column in the block of SRAM cells for the parallel read operation, the block of SRAM cells for the parallel read operation comprising two or more columns;
simultaneously asserting the WL for each row in the block of SRAM cells for the parallel write operation, the block of SRAM cells for the parallel read operation comprising two or more rows; and
simultaneously sensing a logic value on the BL and BLN for each of the two or more columns in the block of SRAM cells for the parallel read operation.

6. The method of claim 5 further comprising, for each block of SRAM cells read by the one or more parallel read operations, identifying a column in the two or more columns in the block of SRAM cells for the parallel read operation as including a failed SRAM cell if the logic value of both the BL and the BLN of the column is a logic zero.

7. The method of claim 5 wherein each block of SRAM cells read by the one or more parallel read operations comprises SRAM cells in one or more column groups, and the method further comprises:
for each block of SRAM cells read by the one or more parallel read operations, identifying a column group in the one or more column groups in the block of SRAM cells as including a failed SRAM cell if the logic value of both the BL and the BLN of at least one column in the column group is a logic zero.

8. The method of claim 1 further comprising:
stressing the plurality of SRAM cells via one or more parallel stress operations, where each parallel stress operation of the one or more parallel stress operations stresses a different block of the SRAM cells from the plurality of SRAM cells.

9. The method of claim 8 wherein stressing the plurality of SRAM cells via the one or more parallel stress operations comprises stressing the plurality of SRAM cells to test for write margin via the one or more parallel stress operations.

10. The method of claim 9 wherein each of the one or more parallel stress operations comprises:
driving, for each column in the block of SRAM cells for the parallel stress operation, one of the BL and the BLN for the column to a voltage level that corresponds to a complement of the desired precondition logic value; and
simultaneously asserting the WLs of all rows in the block of SRAM cells for the parallel stress operation to a word line voltage that is less than a high reference voltage utilized by the SRAM cells in the block of SRAM cells for the parallel stress operation, the block of SRAM cells for the parallel stress operation comprising two or more rows and two or more columns.

11. The method of claim 10 wherein the word line voltage is less than the high reference voltage utilized by the SRAM cells in the block of SRAM cells for the parallel stress operation by an amount that should not cause the complement of the desired precondition logic value to be written to the SRAM cells in the block of SRAM cells for the parallel stress operation.

12. The method of claim 10 wherein the word line voltage is less than the high reference voltage utilized by the SRAM cells in the block of SRAM cells for the parallel stress operation by an amount that should cause the complement of the desired precondition logic value to be written to the SRAM cells in the block of SRAM cells for the parallel stress operation.

13. The method of claim 9 wherein each of the one or more parallel stress operations comprises:
   driving, for each column in the block of SRAM cells for the parallel stress operation, one of the BL and the BLN for the column that is connected to output nodes of the SRAM cells in that column that store a voltage level corresponding to a logic one to a low bit line voltage level that is greater than a low reference voltage utilized by the SRAM cells in the block of SRAM cells for the parallel stress operation; and
   simultaneously asserting the WLs of all rows in the block of SRAM cells for the parallel stress operation, the block of SRAM cells for the parallel stress operation comprising two or more rows and two or more columns.

14. The method of claim 13 wherein the low bit line voltage level is greater than the low reference voltage utilized by the SRAM cells in the block of SRAM cells for the parallel stress operation by an amount that should not cause a complement of the desired precondition logic value to be written to the SRAM cells in the block of SRAM cells for the parallel stress operation.

15. The method of claim 13 wherein the low bit line voltage level is greater than the low reference voltage utilized by the SRAM cells in the block of SRAM cells for the parallel stress operation by an amount that should cause a complement of the desired precondition logic value to be written to the SRAM cells in the block of SRAM cells for the parallel stress operation.

16. The method of claim 8 wherein stressing the plurality of SRAM cells via the one or more parallel stress operations comprises stressing the plurality of SRAM cells to test for read static noise margin via the one or more parallel stress operations.

17. The method of claim 16 wherein each of the one or more parallel stress operations comprises:
   precharging the BL and the BLN for each column in the block of SRAM cells for the parallel stress operation to a precharge voltage level that is greater than a high reference voltage utilized by the SRAM cells in the block of SRAM cells for the parallel stress operation; and
   simultaneously asserting the WLs of all rows in the block of SRAM cells for the parallel stress operation, the block of SRAM cells for the parallel stress operation comprising two or more rows and two or more columns.

18. The method of claim 16 wherein each of the one or more parallel stress operations comprises:
   precharging the BL and the BLN for each column in the block of SRAM cells for the parallel stress operation; and
   simultaneously asserting the WLs of all rows in the block of SRAM cells for the parallel stress operation to a word line voltage that is greater than a high reference voltage utilized by the SRAM cells in the block of SRAM cells for the parallel stress operation, the block of SRAM cells for the parallel stress operation comprising two or more rows and two or more columns.

19. The method of claim 16 wherein each of the one or more parallel stress operations comprises:
   driving one of the BL and the BLN for each column in the block of SRAM cells for the parallel stress operation to a voltage level that is less than a high reference voltage utilized by the SRAM cells in the block of SRAM cells for the parallel stress operation and greater than the high reference voltage divided by 2;
   driving the other one of the BL and the BLN for each column in the block of SRAM cells for the parallel stress operation to a voltage level that is greater than a low reference voltage utilized by the SRAM cells in the block of SRAM cells for the parallel stress operation and less than the high reference voltage divided by 2; and
   simultaneously asserting the WLs of all rows in the block of SRAM cells for the parallel stress operation, the block of SRAM cells for the parallel stress operation comprising two or more rows and two or more columns.

20. The method of claim 1 wherein:
   writing to the SRAM cells in each column of the plurality of columns is enabled by a corresponding write enable (WE) signal; and
   performing the one or more parallel test-operations on the plurality of SRAM cells comprises simultaneously asserting the WLs of two or more of the plurality of rows and the WEs of two or more of the plurality of columns.

21. The method of claim 1 wherein:
   writing to the SRAM cells in each column of the plurality of columns is enabled by a corresponding column select signal; and
   performing the one or more parallel write operations on the plurality of SRAM cells comprises simultaneously asserting the WLs of two or more of the plurality of rows and the column select signals of two or more of the plurality of columns.

22. An integrated circuit comprising:
   a bank of Static Random Access Memory (SRAM) cells comprising a plurality of SRAM cells arranged in a plurality of rows and one or more column groups each comprising a different plurality of columns, wherein each row of the plurality of rows has a corresponding word line (WL), each column of the plurality of columns has a corresponding bit line (BL) and bit line not (BLN), and, for each column group of the one or more column groups, writing to the SRAM cells in each column in the column group is enabled by a corresponding control signal;
   for each column group of the one or more column groups, a Y-multiplexer configured to connect the BLs and BLNs of the plurality of columns in the column group to write circuitry under control of a plurality of column select signals each corresponding to a different one of the plurality of columns; and
   Y-decoder circuitry configured to:
      in a first mode of operation, simultaneously assert two or more of the plurality of column select signals to simultaneously select two or more columns per column group; and
      in a second mode of operation, assert only one of the plurality of column select signals at a time such that only one column per column group is selected at a time.

23. The integrated circuit of claim 22 wherein the circuitry further comprises X-decoder and driver circuitry configured to:
   in the first mode of operation, simultaneously assert the WLs of two or more of the plurality of rows; and in the second mode of operation, assert the WL of only one of the plurality of rows at a time.

24. The integrated circuit of claim 22 wherein:
the circuitry further comprises write enable generation circuitry configured to generate a plurality of write enable signals each enabling writing to the SRAM cells in a different one of the plurality of rows in each of the one or more column groups, the write enable generation circuitry further adapted to:
  in the first mode of operation, simultaneously assert two or more of the plurality of write enable signals to simultaneously enable writing to two or more of the plurality of rows in each of the one or more column groups; and
  in second mode of operation, assert only one of the plurality of write enable signals at a time such that writing is enabled to only one of the plurality of rows in each of the one or more column groups at a time.

25. The integrated circuit of claim 22 further comprising sense circuitry adapted to simultaneously sense a logic level of the BL and the BLN of each of the plurality of columns in each of the one or more column groups.

26. The integrated circuit of claim 25 wherein, for each column group of the one or more column groups, the sense circuitry is further adapted to provide an output that is indicative of a failed SRAM cell in the column group when both the BL and the BLN for one of the plurality of columns in the column group are sensed at a logic level zero.

27. The integrated circuit of claim 25 wherein the sense circuitry is further adapted to, for each column of the plurality of columns in each of the one or more column groups, provide an output that is indicative of a failed SRAM cell in the column if the logic level of both the BL and the BLN of the column is a logic level zero.

28. The integrated circuit of claim 25 wherein the sense circuitry comprises, for each column of the plurality of columns in each of the one or more column groups, a NOR gate having a first input coupled to the BL for the column and a second input coupled to the BLN for the column.

29. The integrated circuit of claim 28 wherein the sense circuitry further comprises, for each column group of the one or more column groups, an OR gate having inputs connected to outputs of the NOR gates for the plurality of columns in the column group.

30. The integrated circuit of claim 22 wherein, during the first mode of operation, a high reference voltage for the plurality of SRAM cells is separable from a high reference voltage utilized when asserting the WLs high.

31. The integrated circuit of claim 22 wherein, during the second mode of operation, the high reference voltage for the plurality of SRAM cells is coupled to the high reference voltage utilized when asserting the WLs high.

32. The integrated circuit of claim 22 wherein, during the first mode of operation, a high reference voltage for the plurality of SRAM cells is separable from a high reference voltage utilized to precharge BLs and BLNs for the plurality of SRAM cells.

33. The integrated circuit of claim 32 wherein, during the second mode of operation, the high reference voltage for the plurality of SRAM cells is coupled to the high reference voltage utilized to precharge the BLs and the BLNs for the plurality of SRAM cells.

34. The integrated circuit of claim 22 wherein, during the first mode of operation, a low write voltage for the plurality of SRAM cells is separable from a low reference voltage for the plurality of SRAM cells.

35. The integrated circuit of claim 34 wherein, during the second mode of operation, the low write voltage for the plurality of SRAM cells is coupled to the low reference voltage for the plurality of SRAM cells.

* * * * *

UNITED STATES PATENT AND TRADEMARK OFFICE
CERTIFICATE OF CORRECTION

PATENT NO. : 8,966,329 B2  
APPLICATION NO. : 13/808438  
DATED : February 24, 2015  
INVENTOR(S) : Lawrence T. Clark and Yu Cao It is certified that error appears in the above-identified patent and that said Letters Patent is hereby corrected as shown below:

In the Specification

In column 9, line 47, replace "$V_{33}$" with --$V_{SS}$--.

In the Claims

In claim 24, in column 27, line 14, replace "in second mode" with --in the second mode--.

In claim 31, in column 28, line 13, replace "of claim 22" with --of claim 30--.

Signed and Sealed this  
Seventh Day of July, 2015

Michelle K. Lee  
*Director of the United States Patent and Trademark Office*